US010928141B2

(12) United States Patent
Kenney et al.

(10) Patent No.: US 10,928,141 B2
(45) Date of Patent: Feb. 23, 2021

(54) HEAT EXCHANGER FOR COOLING MULTIPLE LAYERS OF ELECTRONIC MODULES

(71) Applicant: Dana Canada Corporation, Oakville (CA)

(72) Inventors: Benjamin A. Kenney, Toronto (CA); Meinrad K. A. Maehler, Oakville (CA); Kenneth M. A. Abels, Oakville (CA); Jiang Feng Yu, Mississauga (CA)

(73) Assignee: DANA CANADA CORPORATION, Oakville (CA)

( * ) Notice: Subject to any disclaimer, the term of this patent is extended or adjusted under 35 U.S.C. 154(b) by 0 days.

(21) Appl. No.: 15/913,004

(22) Filed: Mar. 6, 2018

(65) Prior Publication Data

US 2018/0252479 A1    Sep. 6, 2018

Related U.S. Application Data

(60) Provisional application No. 62/467,459, filed on Mar. 6, 2017.

(30) Foreign Application Priority Data

Oct. 19, 2017 (CN) .......................... 201710979228.3

(51) Int. Cl.
*F28F 3/08* (2006.01)
*F28F 13/12* (2006.01)
(Continued)

(52) U.S. Cl.
CPC ............ *F28F 3/086* (2013.01); *F28D 1/0325* (2013.01); *F28D 1/05358* (2013.01);
(Continued)

(58) Field of Classification Search
CPC .. F28F 3/086; F28F 3/025; F28F 3/046; F28F 9/0243; F28F 13/12; F28F 2225/04;
(Continued)

(56) References Cited

U.S. PATENT DOCUMENTS 3,261,904 A    7/1966   Wulc
3,551,758 A    12/1970  Ferree
(Continued)

FOREIGN PATENT DOCUMENTS

| CN | 105324624 A | 2/2016 |
| CN | 207491429 U | 6/2018 |
| WO | 2016095804 A1 | 6/2016 |

OTHER PUBLICATIONS

China National Intellectual Property Administration, Office Action and Search Report Issued in Application No. 201710979228.3, dated Jul. 1, 2020, 12 pages.
(Continued)

*Primary Examiner* — Tho V Duong
(74) *Attorney, Agent, or Firm* — McCoy Russell LLP

(57) ABSTRACT

A stacked-plate heat exchanger for cooling a plurality of heat-generating electronic components arranged in a plurality of layers comprises a stack of flat tubes defining a plurality of parallel fluid flow passages, the tubes being separated by spaces for receiving the electronic components. One or more flow-restricting ribs is arranged within at least some of the fluid flow passages to partially block fluid flow between at least one the manifolds and the heat transfer area by reducing the height of the fluid flow passage outside the heat transfer area, along at least a portion of the width of the fluid flow passage, in order to improve the flow distribution of a heat transfer fluid between and within the fluid flow passages of the heat exchanger, and to minimize bypass flow at the outer edges of the fluid flow passage.

11 Claims, 26 Drawing Sheets

(51) Int. Cl.

| | |
|---|---|
| *F28F 9/02* | (2006.01) |
| *H01L 23/433* | (2006.01) |
| *H05K 7/20* | (2006.01) |
| *F28F 3/04* | (2006.01) |
| *H01L 23/473* | (2006.01) |
| *F28D 1/053* | (2006.01) |
| *H01L 23/40* | (2006.01) |
| *F28D 1/03* | (2006.01) |
| *F28F 3/02* | (2006.01) |
| *H01L 25/18* | (2006.01) |
| *H01L 25/11* | (2006.01) |
| *F28D 21/00* | (2006.01) |

(52) U.S. Cl.
CPC .............. *F28F 3/025* (2013.01); *F28F 3/046* (2013.01); *F28F 9/0243* (2013.01); *F28F 13/12* (2013.01); *H01L 23/4012* (2013.01); *H01L 23/433* (2013.01); *H01L 23/473* (2013.01); *H05K 7/20927* (2013.01); *F28D 2021/0029* (2013.01); *F28F 2225/04* (2013.01); *F28F 2230/00* (2013.01); *F28F 2240/00* (2013.01); *F28F 2275/04* (2013.01); *F28F 2275/205* (2013.01); *H01L 25/112* (2013.01); *H01L 25/18* (2013.01); *H05K 7/2089* (2013.01)

(58) Field of Classification Search
CPC ........... F28F 2230/00; F28F 2021/0029; F28F 2275/205; F28D 1/0325; F28D 1/05358; H01L 23/4012; H01L 23/433; H01L 23/473; H01L 25/112; H05K 7/20927; H05K 7/2089
See application file for complete search history.

(56) References Cited

U.S. PATENT DOCUMENTS

| | | |
|---|---|---|
| RE35,890 E | 9/1998 | So |
| 6,273,183 B1 | 8/2001 | So et al. |
| 6,340,053 B1* | 1/2002 | Wu ................... F28D 9/0012 165/167 |
| 7,200,007 B2* | 4/2007 | Yasui ................... H02M 7/003 165/80.4 |
| 7,231,960 B2* | 6/2007 | Sakai ................... F28F 3/12 165/76 |
| 8,151,868 B2* | 4/2012 | Inagaki ................. F28F 3/025 165/80.4 |
| 8,421,235 B2 | 4/2013 | Ide et al. |
| 8,940,425 B2 | 1/2015 | Toepfer |
| 2003/0024696 A1* | 2/2003 | Haplau-Colan ....... F28D 9/0043 165/153 |
| 2005/0133210 A1 | 6/2005 | Inagaki et al. |
| 2006/0219396 A1* | 10/2006 | Abei ................... H01L 23/473 165/164 |
| 2007/0039717 A1* | 2/2007 | Inagaki ................ H01L 23/473 165/80.4 |
| 2007/0215325 A1 | 9/2007 | Solovitz et al. |
| 2016/0234975 A1 | 8/2016 | Lim et al. |

OTHER PUBLICATIONS

State Intellectual Property Office of the People's Republic of China, Office Action and Search Report Issued in Application No. 201710979228.3, 12 pages. (Submitted with Partial Translation).

* cited by examiner

HEAT EXCHANGER FOR COOLING MULTIPLE LAYERS OF ELECTRONIC MODULES

CROSS-REFERENCE TO RELATED APPLICATION

This application claims priority to and the benefit of U.S. Provisional Patent Application No. 62/467,459 filed Mar. 6, 2017 and Chinese Patent Application No. 201710979228.3 filed Oct. 19, 2017, the contents of which are incorporated herein by reference.

FIELD

The present disclosure relates to compact heat exchangers for dual-sided cooling of heat-generating electronic components arranged in a plurality of layers.

BACKGROUND

Electric vehicles ("EV") and hybrid electric vehicles ("HEV") employ power electronics devices which generate significant amounts of heat energy. This heat energy must be dissipated to avoid excessive heating of these devices, which could lead to damage or reduced performance.

Automotive power electronics devices typically include one or more heat-generating electronic components such as transistors, resistors, capacitors, field effect transistors (FETS), isolated gate bipolar transistors (IGBTs), power inverters, DC to DC converters and DC to AC converters. These components may be mounted on a substrate such as a printed circuit board.

Although the structure of automotive power electronics devices is variable, the power electronic devices in some applications are provided with opposed planar faces along which cooling can be effected. IGBTs are an example of power electronic devices which may have this structure. A typical EV or HEV may include many IGBTs, which may be arranged in multiple groups of three. IGBTs can be cooled by contacting one or both of the opposed planar faces of each IGBT with a heat sink. To enhance heat transfer, a cooling fluid such as air or a liquid coolant may be circulated along or through the heat sink. For example, as disclosed in commonly assigned U.S. Provisional Application No. 62/433,936 filed on Dec. 14, 2016, a heat exchanger for dual-sided cooling of electronic components may comprise a pair of heat sinks in contact with opposite planar faces of one or more electronic components arranged in a single layer.

Due to space limitations and cost considerations it may be advantageous to package the heat-generating electronic components in a compact array and to provide a single brazed heat exchanger to cool both side surfaces of each electronic component in the array. Heat exchangers of this type are known, for example in commonly assigned International Application No. PCT/CA2016/051010 filed on Aug. 26, 2016. However, there remains a need for simple and effective heat exchangers for dual-sided cooling of heat-generating electronic components packaged in a compact array, which provide effective thermal communication with the electronic components and balanced flow of cooling fluid along the side surfaces of all electronic components in the package.

SUMMARY

In one aspect, there is provided a heat exchanger assembly comprising: a heat exchanger core comprising a plurality of flat tubes, wherein each said flat tube encloses an elongate fluid flow passage having a top wall, a bottom wall and a pair of outer edges transversely spaced from one another, wherein a width of the fluid flow passage is defined between the outer edges; wherein the flat tubes are arranged in a stack with the fluid flow passages in spaced parallel relation to one another along a height of the stack, such that a plurality of spaces for receiving heat-generating electronic components are defined between adjacent flat tubes, throughout the height of the stack, with the flat tubes defining heat transfer surfaces along which the flat tubes are adapted for thermal contact with the heat-generating components; wherein the flat tubes are joined together to form an inlet manifold and an outlet manifold, each of the manifolds extending throughout the height of the stack, with the inlet manifold being in direct flow communication with a first end of each said fluid flow passage and the outlet manifold being in direct flow communication with a second end of each said fluid flow passage; wherein the fluid flow passage of each said flat tube has a heat transfer area located between the manifolds, wherein a turbulence-enhancing insert is provided inside the heat transfer area, and wherein the heat transfer area in each said fluid flow passage is directly opposite to at least one said heat transfer surface on an outer surface of said flat tube, wherein the fluid flow passage has a maximum height between the top and bottom wall in said heat transfer area, with the turbulence-enhancing insert being in direct thermal contact with the top and bottom walls; wherein the heat exchanger assembly further comprises one or more flow-restricting ribs arranged within at least some of the fluid flow passages to partially block fluid flow between at least one the manifolds and the heat transfer area by reducing the height of the fluid flow passage outside the heat transfer area, along at least a portion of the width of the fluid flow passage.

In an embodiment, each of the flat tubes comprises a pair of mating, elongate core plates having raised, apertured bosses at their opposite ends, wherein the raised bosses of adjacent flat tubes are joined together so as to define the inlet manifold and the outlet manifold, and wherein central portions of a pair of mating core plates define the top and bottom walls of each said flat tube.

In an embodiment, the raised, aperture bosses have a height such that, prior to insertion of the heat-generating electronic components into the spaces between the flat tubes, the height of each of the spaces is slightly greater than a thickness of one of the heat-generating components, to permit the heat-generating electronic components to be inserted into the spaces between the heat transfer surfaces; wherein the bosses each have a compressible sidewall region to permit the height of the spaces between the flat tubes to be reduced by the application of a force along a compression axis parallel to the height of the manifolds; wherein each of the core plates further comprises one or more support protrusions, each of which is located in a substantially flat area proximate to a base of one of the raised bosses; wherein each of the support protrusions extends from an underside of the core plate in a direction opposite to a direction in which the raised bosses extend from a top of the core plate; and wherein each of the support protrusions has a height defined as a distance between a base and a top surface thereof, the height being such that the top surface of the support protrusion is substantially coplanar with the peripheral flange of the core plate; such that when the core plates are assembled to form said flat tubes, the support protrusions of one core plate of each said flat tube will be in contact with the support protrusions of the other core plate forming the flat tube.

In another aspect, there is provided a heat exchanger module comprising a heat exchanger assembly with raised apertured bosses with compressible sidewall regions, the heat exchanger module further comprising a plurality of said heat-generating components and a plurality of rigid compression fixtures for application to the heat exchanger module during assembly thereof, and immediately prior to a step of applying a compressive force to the heat exchanger along the height of each said manifold so as to bring the heat transfer surfaces of the flat tubes into thermal contact with side surfaces of the heat-generating electronic components Each said compression fixture is substantially U-shaped, having a thickness which is substantially the same as that of the heat-generating electronic components; wherein each of the compression fixtures is insertable between adjacent flat tubes so as to surround the raised bosses of the flat tubes along three sides thereof and prevent unwanted deformation of the core plates during the step of applying a compressive force.

According to another aspect, there is provided a method for assembling a heat exchanger module comprising a brazed heat exchanger having raised, aperture bosses with compressible sidewall regions, as described above. The method comprises inserting one or more heat-generating electronic components into the spaces between adjacent flat tubes; and applying a compressive force to the heat exchanger along the height of each said manifold so as to bring the heat transfer surfaces of the flat tubes into thermal contact with side surfaces of the heat-generating electronic components.

In an embodiment, the above-described method further comprises the step of applying a plurality of rigid compression fixtures to the heat exchanger module prior to said step of applying a compressive force; wherein each said compression fixture is substantially U-shaped, having a thickness which is substantially the same as that of the heat-generating electronic components; wherein each of the compression fixtures is inserted between adjacent flat tubes so as to surround the raised bosses of the flat tubes along three sides thereof and prevent unwanted deformation of the core plates during the compression step.

In an embodiment, the heat exchanger has a U-flow configuration with the inlet and outlet manifolds located at a first end of the core; wherein every second one of the flat tubes is in flow communication only with the inlet manifold and defines an inlet fluid flow passage, while each of the other flat tubes is in flow communication only with the outlet manifold and defines an outlet fluid flow passage; and wherein a communication passage is provided between each of the inlet fluid flow passages and an adjacent one of the outlet fluid flow passages, each of the communication passages being located proximate to second end of the core which is distal to the manifolds. According to this embodiment, the portions of the flat tubes which form the manifolds are located in projecting end portions of the flat tubes. According to this embodiment, the outer edges of the flat tubes may be provided with spaced apertures through which tie rods are passed, the tie rods having threaded ends provided with nuts and being adapted for compressing the stack of flat tubes into thermal contact with the electronic components.

According to another aspect, there is provided a method for assembling a heat exchanger module comprising a heat exchanger having a U-flow configuration as described above. The method comprises: providing the flat tubes of the heat exchanger assembly; applying the resilient sealing members to the first and/or second tubular segments; assembling the heat exchanger assembly by inserting the first tubular segments into the second tubular segments so as to form the tubular manifolds and the tubular communication passage; inserting one or more heat-generating electronic components into the spaces between adjacent flat tubes; and applying a compressive force to the heat exchanger along the height of each said manifold with tie rods as described above so as to bring the heat transfer surfaces of the flat tubes into thermal contact with side surfaces of the heat-generating electronic components.

In another aspect, there is provided a heat exchanger module comprising the U-flow heat exchanger described above, wherein the first tubular segments are received in the second tubular segments so as to form the tubular manifolds and the tubular communication passage; wherein one or more of said heat-generating electronic components are received in the spaces between adjacent flat tubes; and wherein the heat exchanger assembly is maintained under compression by a plurality of said tie rods, wherein a compressive force applied by said tie rods is directed along the height of each said manifold such that the heat transfer surfaces are in thermal contact with side surfaces of the heat-generating electronic components.

BRIEF DESCRIPTION OF DRAWINGS

The invention will now be described, by way of example only, with reference to the accompanying drawings in which.

DETAILED DESCRIPTION

Figure 1:
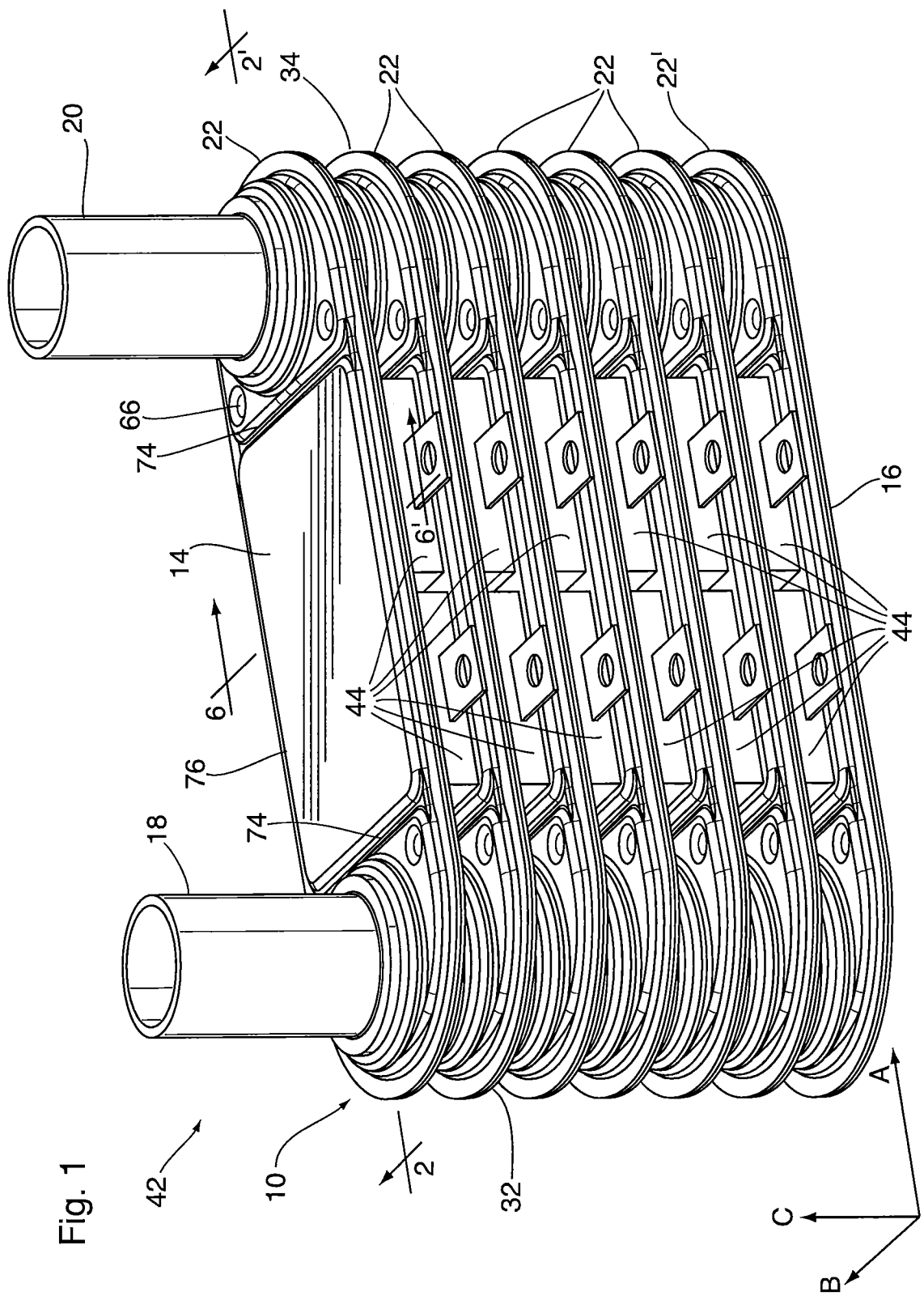
FIG. 1 is a top perspective view of a heat exchanger according to a first embodiment.

The following is a detailed description of heat exchangers according to certain example embodiments. The heat exchangers described herein are compact heat exchangers comprising a stack of core plates, and are sometimes referred to herein as "stacked-plate" heat exchangers. To minimize cost, most or all of the core plates in the stack may be identical to one another. Also, the heat exchanger may have a brazed, unitary construction. Since brazing of heat exchangers is conducted at high temperatures and typically involves heating the entire heat exchanger assembly in a brazing oven, the heat exchanger core plates must be brazed together prior to assembly of a heat exchanger module comprising the heat exchanger and the heat-generating electronic components.

The core plates making up the heat exchanger provide spaced-apart heat transfer surfaces arranged to be in thermal contact with a plurality of heat-generating electronic components having opposed planar side surfaces, wherein each of the opposed planar side surfaces of each heat-generating electronic component is in thermal contact with a heat transfer surface of the heat exchanger, and wherein the heat-generating electronic components are arranged in a compact array, such as a plurality of spaced-apart layers.

In order to allow assembly of the heat exchanger module, the core plates of the heat exchanger are provided with features which permit compression of the heat exchanger, post-brazing, to produce permanent deformation of the heat exchanger which brings the heat transfer surfaces thereof into intimate thermal contact with the opposed side surfaces of the heat-generating electronic components without negatively affecting the flow distribution of heat transfer fluid between and within the fluid flow passages of the heat exchanger.

In order to maximize cooling efficiency, the core plates of the heat exchanger are provided with features which provide adequate fluid back pressure to control fluid flow distribution between and within the fluid flow passages, and which also reduce bypass flow within the fluid flow passages.

A heat exchanger assembly 10 according to a first example embodiment, and a heat exchanger module 42 comprising heat exchanger assembly 10 and a plurality of heat-generating electronic components 44, are now described below with reference to FIGS. 1 to 6.

Heat exchanger assembly 10 includes a core comprising a plurality of elongate flat tubes 22, each of which encloses an elongate fluid flow passage 36. The flat tubes are arranged in a stack with the fluid flow passages in spaced parallel relation to one another along the height of the stack (along axis C of FIG. 1), such that a plurality of spaces for receiving heat-generating electronic components 44 are defined between adjacent flat tubes 22 throughout the height of the stack, with the flat tubes 22 defining heat transfer surfaces 40 along which the flat tubes 22 are adapted for thermal contact with the heat-generating components 44. The flat tubes 22 are joined together to form an inlet manifold 32 and an outlet manifold 34, each of the manifolds 32, 34 extending throughout the height of the stack, with the inlet manifold 32 being in direct flow communication with a first end of each said fluid flow passage 36 and the outlet manifold 34 being in fluid flow communication with a second end of each said fluid flow passage 36. The first and second ends of the fluid flow passages are longitudinally spaced apart, along axis A.

In the present embodiment the heat exchanger 10 is constructed from core plates, including a plurality of intermediate core plates 12, a top core plate 14 at the top of the plate stack, and a bottom core plate 16 at the bottom of the plate stack. Each flat tube 22 comprises a pair of core plates 12, 14, 16, and therefore the flat tubes 22 are also referred to herein as "plate pairs 22". In the present embodiment, all the intermediate core plates 12 and the top plate 14 are identical to each other, and different from, the bottom plate 16 as further described below. An inlet fitting 18 and an outlet fitting 20 are sealingly secured to the top plate 14, although the locations of the inlet and outlet fittings 18, 20 are variable as discussed further below.

Each core plate 12, 14, 16 in the present embodiment comprises a planar peripheral flange 24 surrounding a raised central portion 26. The core plates 12, 14, 16 of each flat tube 22 are sealingly joined together in face-to-face arrangement along their peripheral flanges 24. In the illustrated embodiment, the flat tubes 22 formed by pairs of intermediate plates 12 are identical to one another, and identical to the uppermost flat tube 22 formed by an intermediate plate 12 and the top plate 14. The lowermost flat tube, formed by an intermediate plate 12 and the lower plate 16, is different from the other flat tubes 22 for reasons discussed below, and is labelled 22' in FIGS. 1 and 2.

Figure 2:
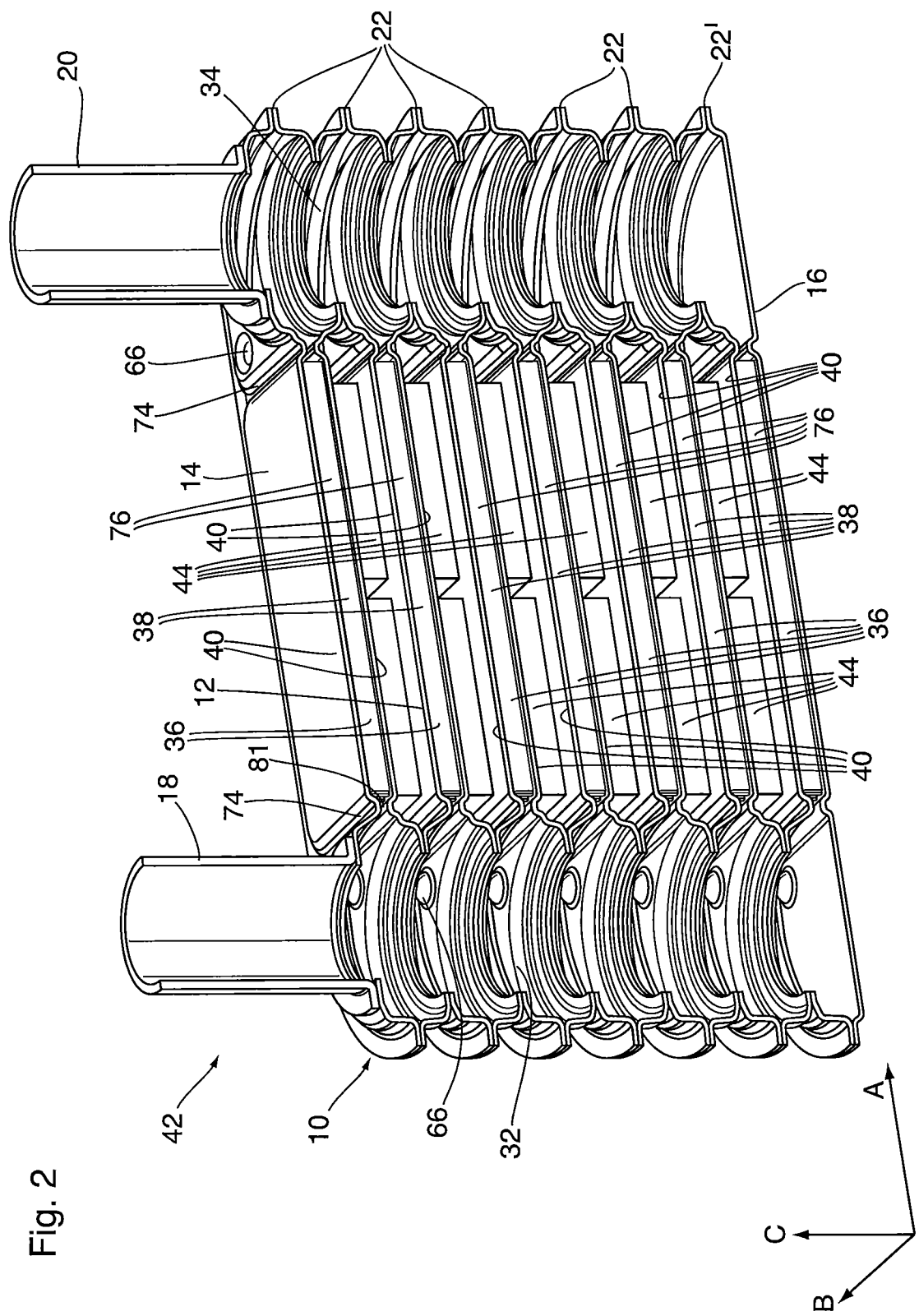
FIG. 2 is cross-section along line 2-2' of FIG. 1.
Figure 3:
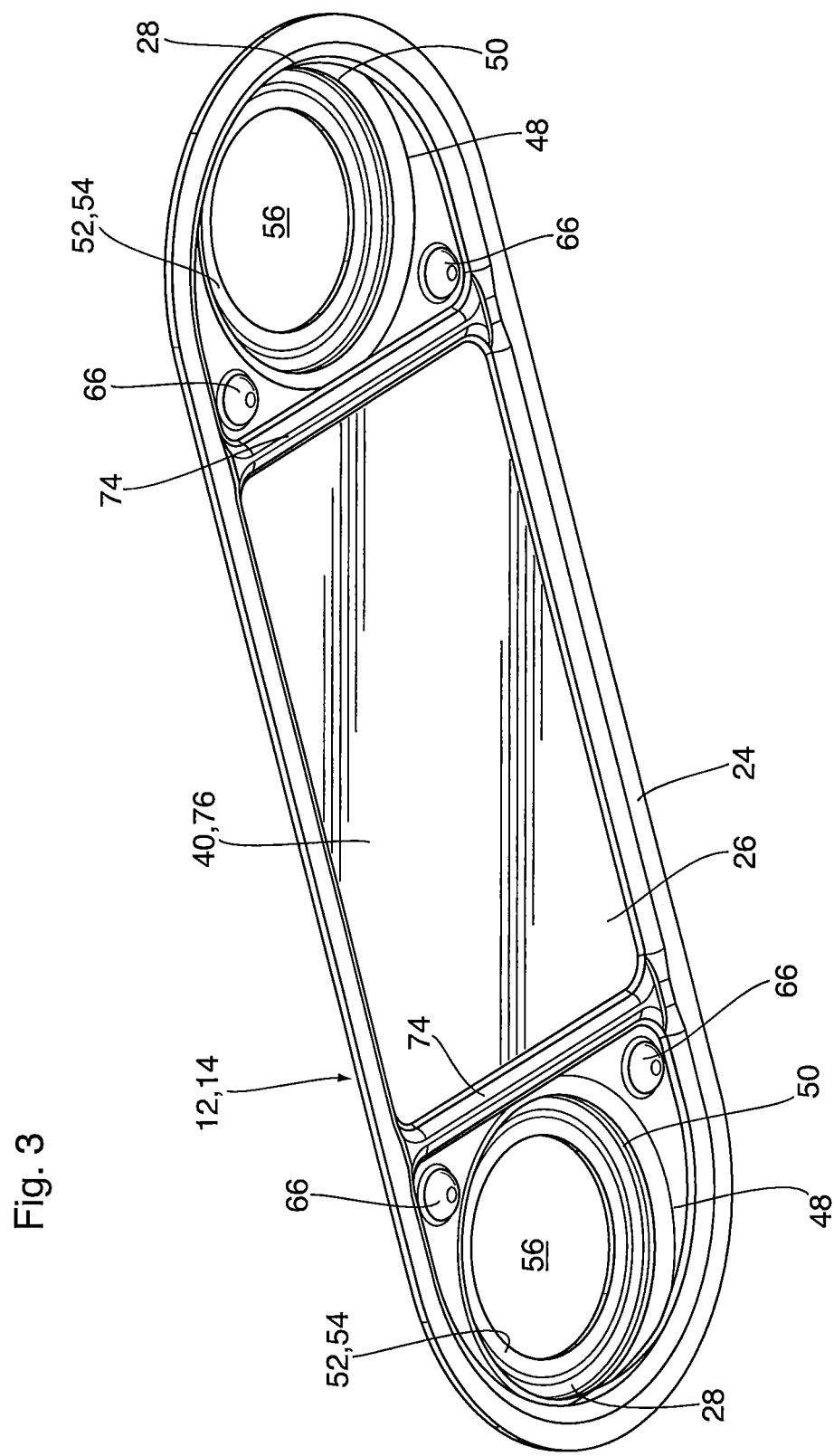
FIG. 3 is a top perspective view of a core plate of the heat exchanger of FIG. 1.
Figure 4:
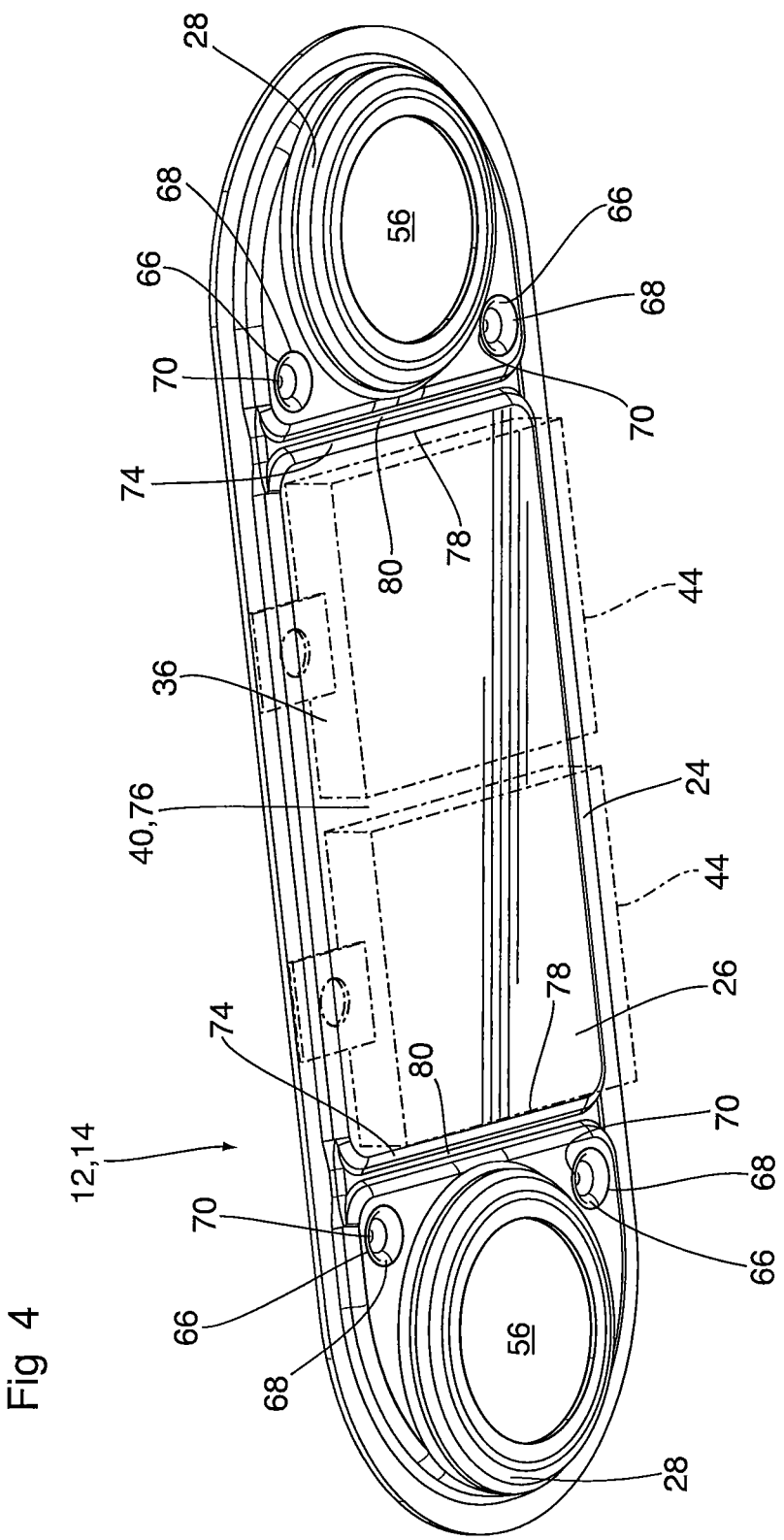
FIG. 4 is a bottom perspective view of a core plate of the heat exchanger of FIG. 1.

The core plates 12, 14, 16 are generally elongate, with opposite ends of each intermediate core plate 12 and opposite ends of the top plate 14 being provided with raised, apertured bosses 28. The raised bosses 28 are located in the raised central portion 26 of each core plate 12, 14. The bottom plate 16 lacks raised bosses 28, and instead may have a central portion 26 which is substantially flat and free of perforations so as to seal the bottom of the heat exchanger 10, as shown in FIG. 2.

Each of the flat tubes 22 has a pair of raised bosses 28 projecting from both of its opposed sides, with the raised bosses 28 of adjacent flat tubes 22 being joined together so as to define an inlet manifold 32 and an outlet manifold 34 at opposite ends of the heat exchanger 10. The lowermost flat tube 22' has a pair of raised bosses 28 projecting from only its upper side, through which it is joined to the raised bosses 28 of an adjacent flat tube. The inlet manifold 32 extends from the inlet fitting 18 to the closed bottom plate 16, and the outlet manifold 34 extends from the outlet fitting 20 to the closed bottom plate 16.

Figure 6:
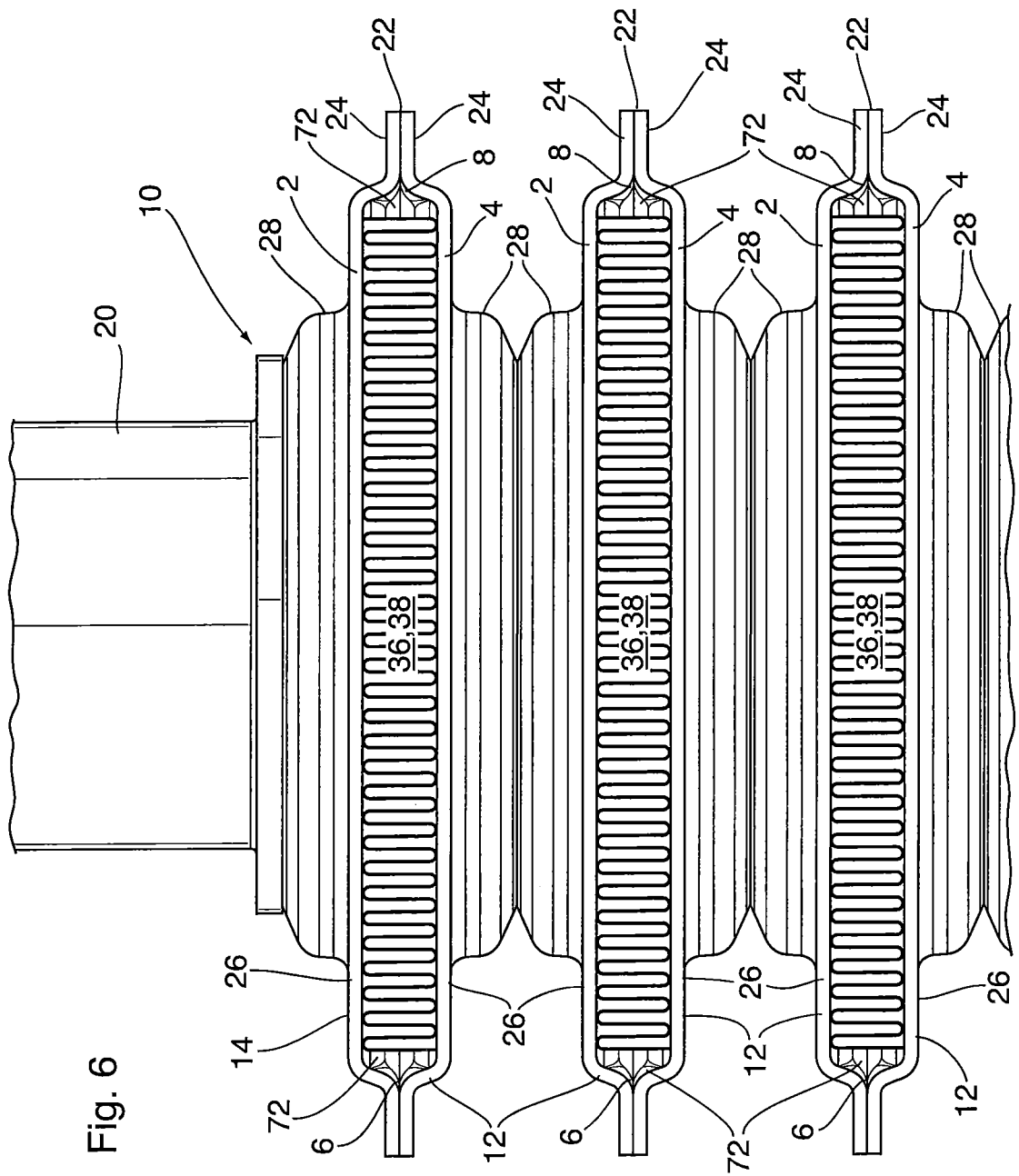
FIG. 6 is a close-up transverse cross-section along line 6-6' of FIG. 1.

Each flat tube 22, 22' encloses a fluid flow passage 36 extending along longitudinal axis A from the inlet manifold 32 to the outlet manifold 34, and between the raised bosses 28 at the opposite ends of each flat tube 22, 22'. The fluid flow passages 36 each have a top wall and a bottom wall which in the present embodiment comprises the central portions 26 of the core plates 12, 14, 16 making up each of the flat tubes 22. The fluid flow passages 36 each have a pair of outer edges which are transversely spaced from one another (along axis B of FIG. 1), wherein the width of the fluid flow passage 36 is defined between the outer edges. In the present embodiment the outer edges of fluid flow passages 36 are located immediately inwardly of the peripheral flanges 24 as can be seen in FIG. 6, for example. The top wall 2, bottom wall 4 and outer edges 6, 8 of flat tubes 22 are labelled in FIG. 6. It will be appreciated that the tubes 22 are not necessarily formed from pairs of core plates 12, 14, 16. Rather, the tubes 22 can each be formed from a single piece of material which is either extruded or folded and sealed along a seam.

Each fluid flow passage 36 has a heat transfer area 76 located between the manifolds 32, 34, wherein a turbulence-enhancing insert 38 may be provided in the heat transfer area 76 of each of the flat tubes 22. Each of the turbulence-enhancing inserts 38 may comprise a fin or a turbulizer. As used herein, the terms "fin" and "turbulizer" are intended to refer to corrugated turbulence-enhancing inserts having a plurality of axially-extending ridges or crests connected by side walls, with the ridges being rounded or flat. As defined herein, a "fin" has continuous ridges whereas a "turbulizer" has ridges which are interrupted along their length, so that axial flow through the turbulizer is tortuous. Turbulizers are sometimes referred to as offset or lanced strip fins, and examples of such turbulizers are described in U.S. Pat. No. Re. 35,890 (So) and U.S. Pat. No. 6,273,183 (So et al.). The patents to So and So et al. are incorporated herein by reference in their entireties.

In the embodiments illustrated herein, the turbulence-enhancing inserts 38 are shown as simple corrugated fins, each comprising a plurality of parallel corrugations 39 extending along the longitudinal axis A. The corrugations 39 are defined by substantially vertical side walls 41 which are arranged in spaced parallel relation to one another, with adjacent side walls 41 being joined together along crests 43 and valleys 45, wherein the crests 43 and valleys 45 are in thermal contact with the top and bottom walls 2, 4 of the fluid flow passage 36, i.e. the fluid flow passage 36 has a maximum height between the top and bottom wall 2, 4 in the heat transfer area 76, with the turbulence-enhancing insert 38 being in direct thermal contact with the top and bottom walls 2, 4.

In the illustrated embodiment the turbulence-enhancing insert 38 has substantially vertical side walls 41 which are free of perforations, and rounded crests and valleys 43, 45. However, it will be appreciated that the side walls 41 may be inclined relative to one another, the side walls may be perforated for example by louvers, and/or the crests and valleys 43, 45 may be angular.

It can be seen that the elongate spaces between adjacent side walls 41 of each turbulence-enhancing insert 38 are open at the opposite ends of the insert 38, thereby permitting fluid flow through the insert 38 along axis A. The fluid flowing through the insert 38 is in thermal contact with the surfaces of the insert 38, such that heat is transferred between the fluid and the insert 38. The insert 38 essentially increases the surface area over which heat is transferred between the heat exchanger core and the fluid flowing therethrough.

A plurality of heat-generating electronic components 44 are located in spaces defined between adjacent flat tubes 22, 22'. Planar heat transfer surfaces 40 are defined along the outer surfaces of the top and bottom walls 2, 4 of flat tubes 22, directly opposite to the fluid flow passages 36 defined therein and directly opposite to the heat transfer area 76. Each of the flat tubes 22 have top and bottom planar heat transfer surfaces 40, while the lowermost flat tube 22' has only a top planar heat transfer surface 40. The heat transfer surfaces 40 defined by adjacent flat tubes 22, 22' are spaced apart from one another by a distance which is substantially the same as twice the height of the raised bosses 28. The height of the bosses 28 is selected such that the spacing between the heat transfer surfaces 40 of adjacent flat tubes 22 is slightly greater than a thickness of the heat-generating components 44, to permit assembly of the heat exchanger module 42 by sliding the heat-generating electronic components 44 into the spaces between adjacent heat transfer surfaces 40, after the heat exchanger 10 is assembled by brazing and prior to compression, as discussed below.

The heat-generating electronic components 44 in the present embodiment are schematically illustrated as rectangular prisms having a pair of opposed side surfaces 46 which are the major surfaces of the rectangular prism and have a generally square or rectangular shape. Each of the heat-generating electronic components 44 may comprise one or more IGBTs and/or diodes which are sandwiched between layers of electrically insulating materials. The drawings show two heat-generating electronic components 44 in spaced, side-by-side arrangement between the heat transfer surfaces 40 of adjacent flat tubes 22, 22', however, each layer of heat-generating electronic components 44 may comprise three separate heat-generating electronic components 44 arranged side-by-side.

As discussed above, the spacing between the heat transfer surfaces 40 of adjacent flat tubes 22 of the post-brazed heat exchanger 10 must initially be sufficient to permit insertion of the heat-generating electronic components 44 therein, so as to assemble heat exchanger module 42. However, intimate thermal contact between the heat transfer surfaces 40 and the side surfaces 46 of the heat-generating electronic components 44 must be achieved in order to provide efficient heat transfer between the heat-generating electronic components 44 and the fluid circulating through the fluid flow passages 36 of heat exchanger 10. Therefore, the heat exchanger 10 is compressible and permanently deformable so as to permit the spacing between the heat transfer surfaces 40 of adjacent flat tubes 22 to be reduced by the application of a force along a compression axis C parallel to the height of the manifolds 32, 34.

Figure 5:
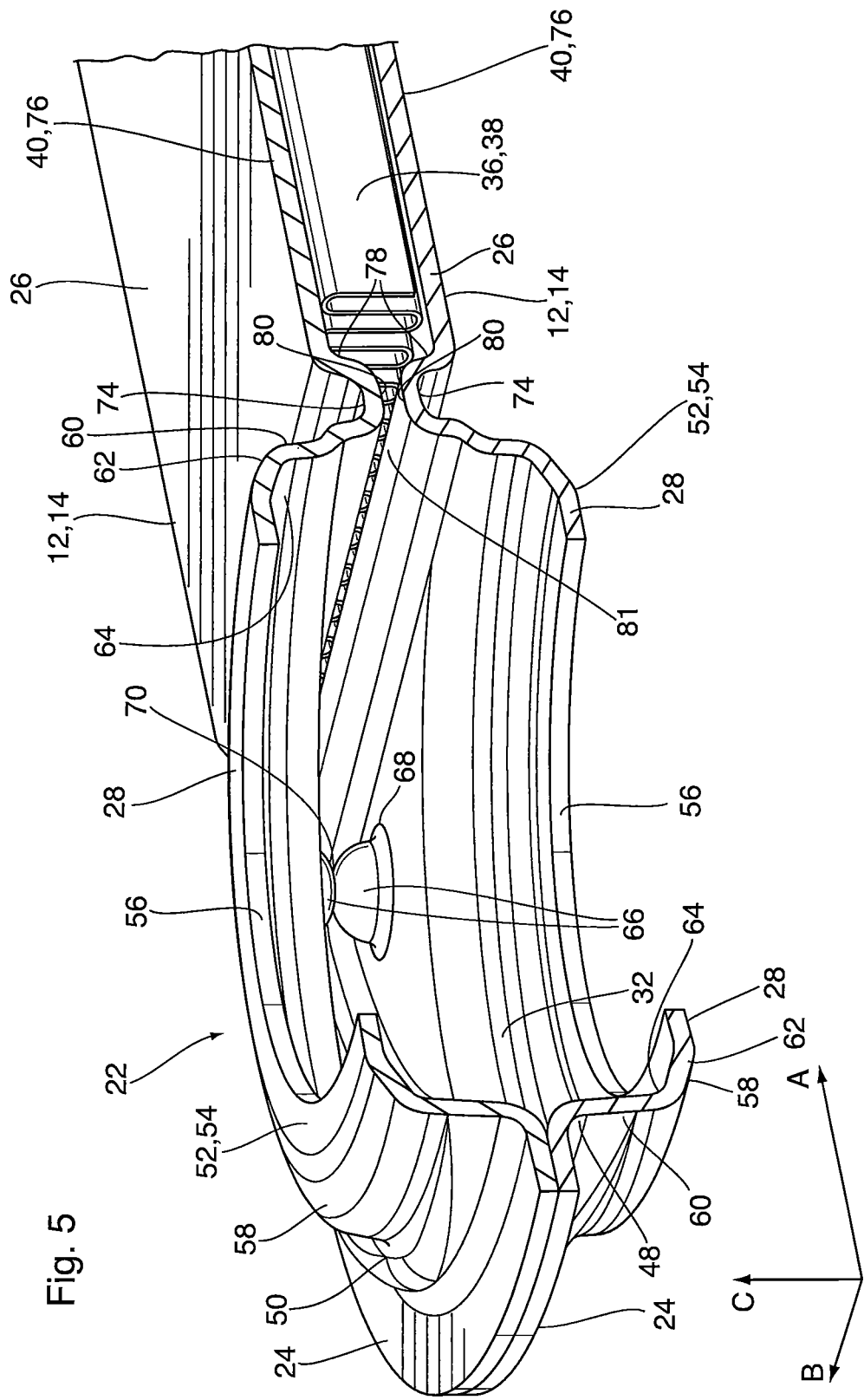
FIG. 5 is an enlarged, partial cross-section showing the left end of a plate pair of the heat exchanger of FIG. 1, taken in the same plane as the cross-section of FIG. 2.

In the present embodiment the raised bosses 28 are formed so as to provide them with a degree of compressibility, permitting them to become slightly flattened by the application of sufficient force along compression axis C. As shown in FIG. 5, each of the raised bosses 28 comprises a sidewall 48 rising above the raised central portion 26 of a core plate 12, 14, from an annular base 50 at which it is joined to the raised central portion 26 to an annular top surface 52 defining a planar sealing surface 54 surrounding a central aperture 56. The planar sealing surfaces 54 are the surfaces along which the raised bosses 28 of the core plates 12, 14, 16 are sealingly joined the raised bosses of adjacent core plates 12, 14, 16, and along which the raised bosses 28 of the top core plate 14 are sealingly joined to the fittings 18, 20.

As also shown in FIG. 5, the sidewalls 48 of the raised bosses 28 are provided comprise a plurality of segments between base 50 and top surface 52. In this regard, the sidewall 48 includes an upstanding wall portion 60 extending upwardly from the base 50 and being angled at about 60-90 degrees relative to axis A and planar peripheral flange 24 of the core plates 12, 14, 16, and which may be vertical or substantially vertical relative to axis A.

Between the upstanding wall portion 60 and the top surface 52 is a compressible region 58 along which the raised bosses 28 of the assembled heat exchanger module 42 can be compressed. Each of the compressible regions 58 comprises an inwardly sloped wall portion 62 which is angled at about 0-30 degrees relative to axis A. The upper end of the upstanding wall portion 60 is joined to the lower end of the sloped wall portion 62 at an angled edge 64, such that an obtuse angle $\alpha$ (see FIGS. 7-8) greater than about 90 degrees and less than about 150 degrees is formed between wall portions 60, 62. The structure of raised bosses 28 is such that the application of a predetermined amount of force along axis C will preferentially result in permanent flattening of the inwardly sloped wall portion 62, permanently reducing angle $\alpha$ without significantly causing deformation in other areas of the raised boss 28.

Figure 7:
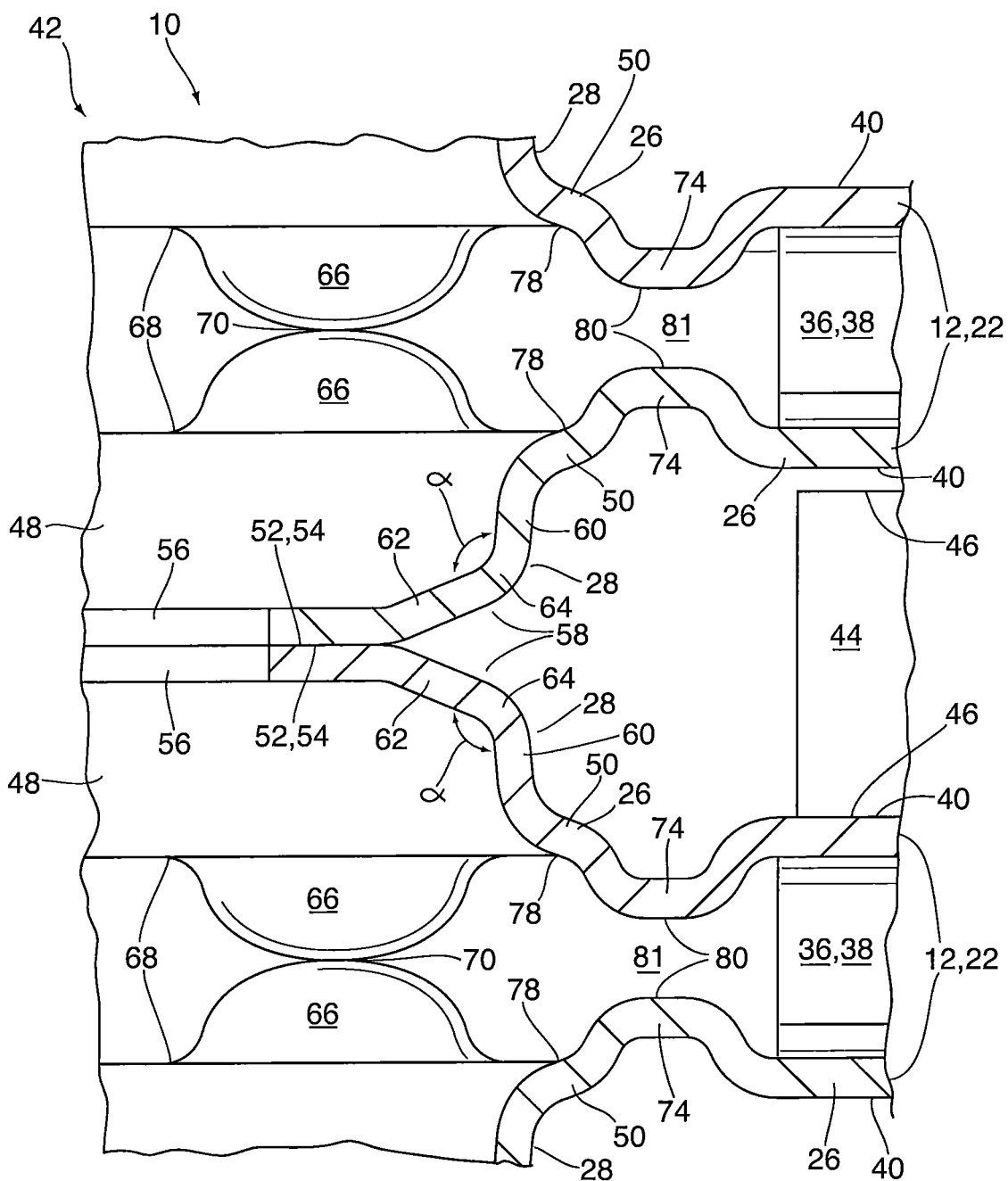
FIG. 7 is an enlarged longitudinal cross-section showing a portion of the heat exchanger module incorporating the heat exchanger of claim 1, before compression.
Figure 8:
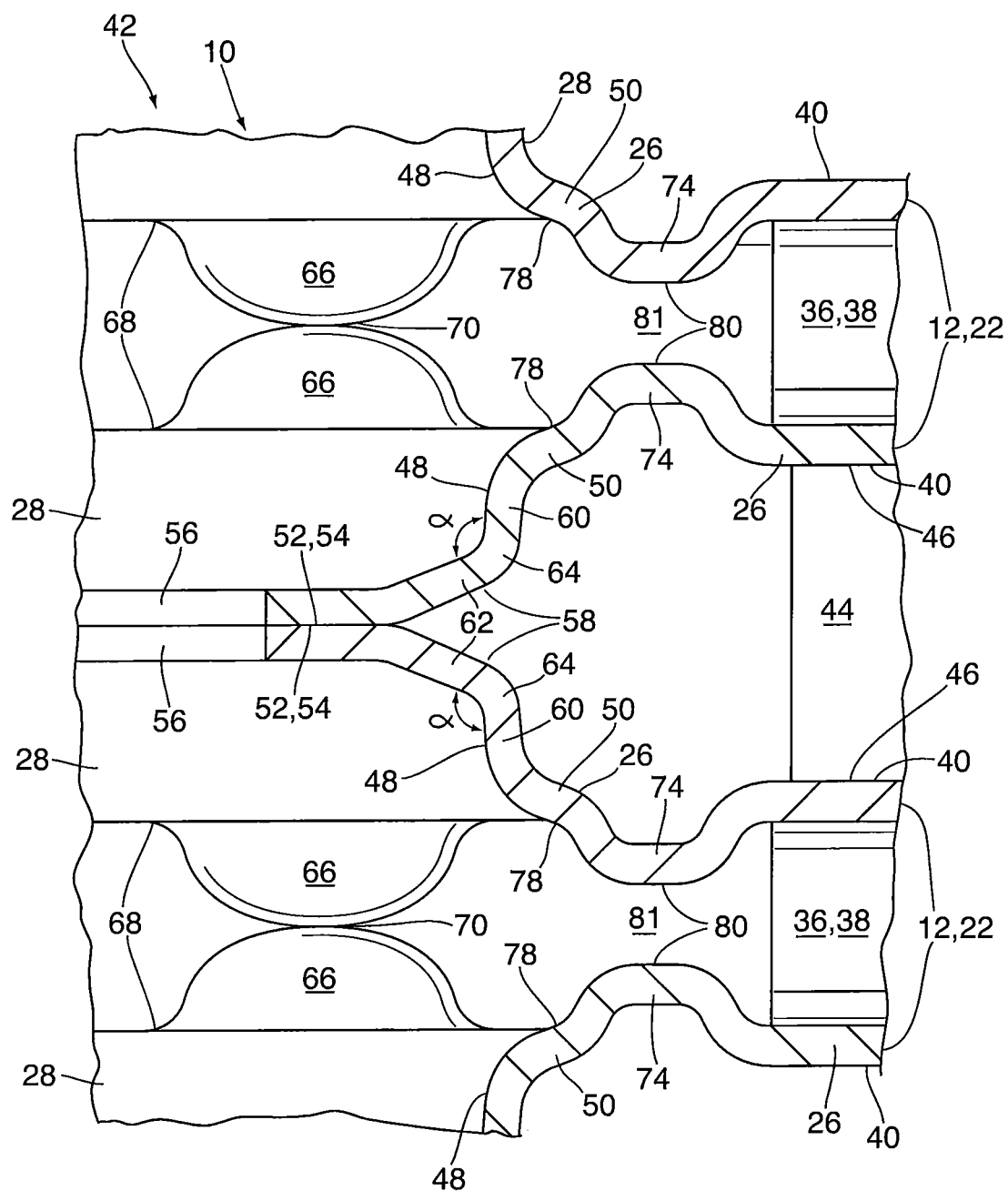
FIG. 8 is a cross-section similar to FIG. 7, showing the heat exchanger module after compression.
Figure 9:
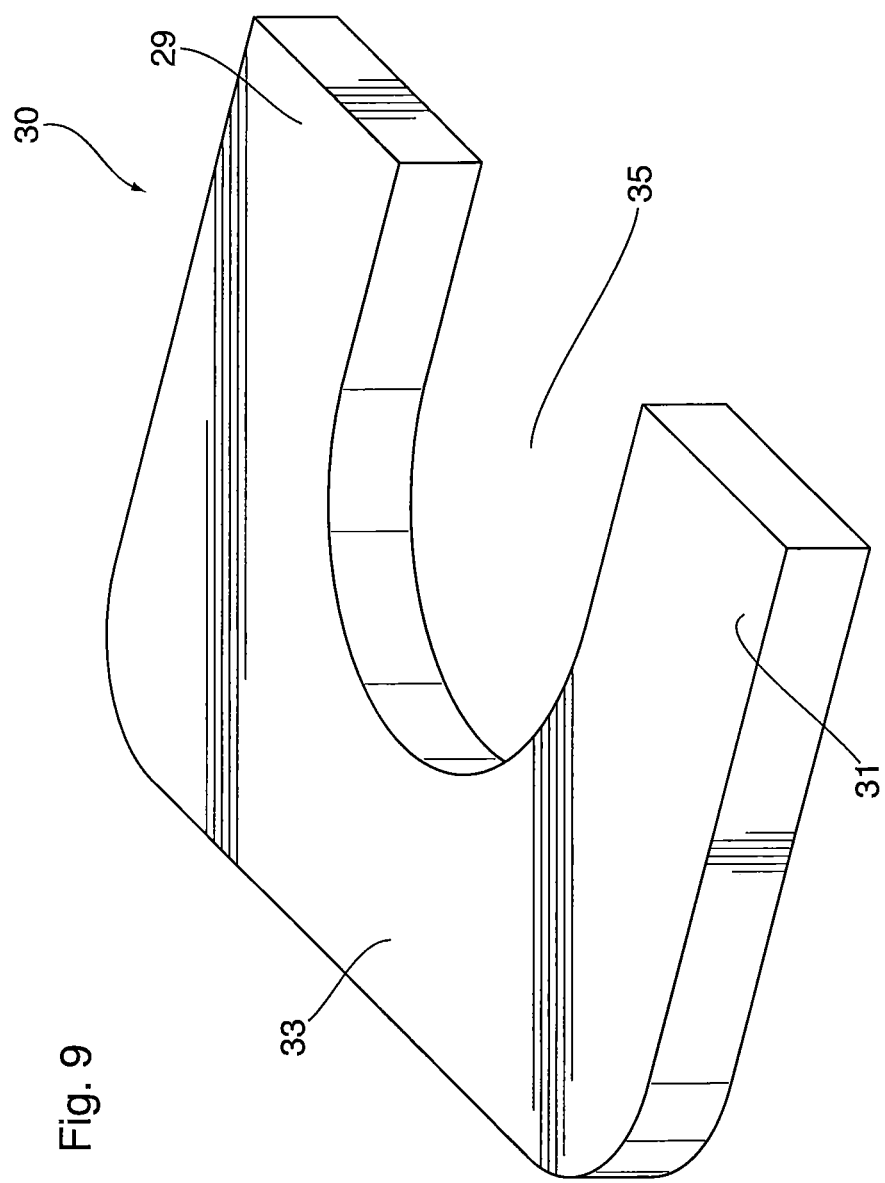
FIG. 9 is an isolated perspective view of a compression fixture.

As illustrated in FIGS. 7 and 8, the height of the raised bosses 28 can be reduced by a sufficient amount to bring the heat transfer surfaces 40 into intimate thermal contact with the side surfaces 46 of the heat-generating electronic components 44. FIG. 7 shows the initial (post-brazing) height of the spaces between the heat transfer surfaces 40 of adjacent flat tubes 22 as being slightly greater than the thickness or height of the heat-generating electronic component 44, such that there is a gap between the heat transfer surface 40 and the side surface 46 of the heat-generating component 44. This permits the heat-generating components 44 to be slid into the spaces between the flat tubes 22 of the brazed heat exchanger 10.

FIG. 8 shows the heat exchanger module 42 after vertical compression of the bosses 28. It can be seen that both side surfaces 46 of the heat-generating electronic component 44 are in contact with the heat transfer surfaces 40 of adjacent flat tubes 22. Furthermore, it can be seen that no deformation has occurred outside the compressible regions 58 of the bosses 28. In this regard, the compression has caused a small amount of flattening in the inwardly sloped wall portion 62, slightly decreasing the angle $\alpha$.

Thermal contact between the heat transfer surfaces 40 of heat exchanger 10 and the side surfaces 46 of the heat-generating electronic components 44 may be enhanced by providing a thin layer of a thermal interface material (TIM) at the interface between heat transfer surfaces 40 and side surfaces 46. The TIM may comprise a thermally conductive grease, wax or metallic material.

Although the compressive forces are localized in the area of the raised bosses 28, the core plates 12, 14, 16 may include additional features to resist deformation of the core plates 12, 14, 16 in areas surrounding the raised bosses 28, particularly in unsupported areas which are substantially flat (i.e. substantially parallel to axis A). For example, in the present embodiment, core plates 12, 14, 16 are provided with one or more protrusions 66 in flat areas adjacent to the raised bosses 28, and extending from the underside of the core plate 12, 14, 16, i.e. in a direction opposite to the direction in which the raised bosses 28 extend from the top of the core plate 12, 14, 16. Two such protrusions 66 in the form of circular dimples are provided at each end of the core plate 12, 14, 16, one on either side of one of the raised bosses 28.

Each of the protrusions 66 may have a height, defined as a distance between the base 68 and the top surface 70 thereof, which is sufficient such that the top surface 70 is substantially coplanar with the peripheral flange 24 of the core plate 12, 14, 16. Accordingly, when the core plates 12, 14, 16 are assembled into flat tubes 22, the protrusions 66 of one core plate 12, 14, 16 may be in contact with, and may be brazed to, the protrusions 66 of the other core plate 12, 14, 16 forming the flat tube 22. In this way, the protrusions 66 prevent unwanted and uncontrolled deformation of portions of the core plates 12, 14 surrounding the raised bosses 28, which may have an adverse impact on performance of the heat exchanger 10. For example, FIGS. 7 and 8 show the opposed protrusions 66 of opposed plates 12 of flat tubes 22 being in contact along their top surfaces 70, thereby preventing unwanted deformation in the raised portions 26 of plates 12 around the bosses 28.

To further prevent unwanted deformation of the core plates 12, 14, 16 in the area of manifolds 32, 34, a series of rigid compression fixtures 30 may be applied to each end of the heat exchanger module 42 during the compression step, as shown in FIGS. 9 to 12. Each compression fixture 30 is a substantially U-shaped block comprising a pair of legs 29, 31 attached to an end portion 33, and having a thickness (along axis C) which is substantially the same as that of the heat-generating electronic components 44 (not shown in FIG. 15). The legs 29, 31 and end portion 33 define a U-shaped cutout 35 which is shaped to form a close fit around the sidewalls 48 of a pair of joined bosses 28.

Figure 10:
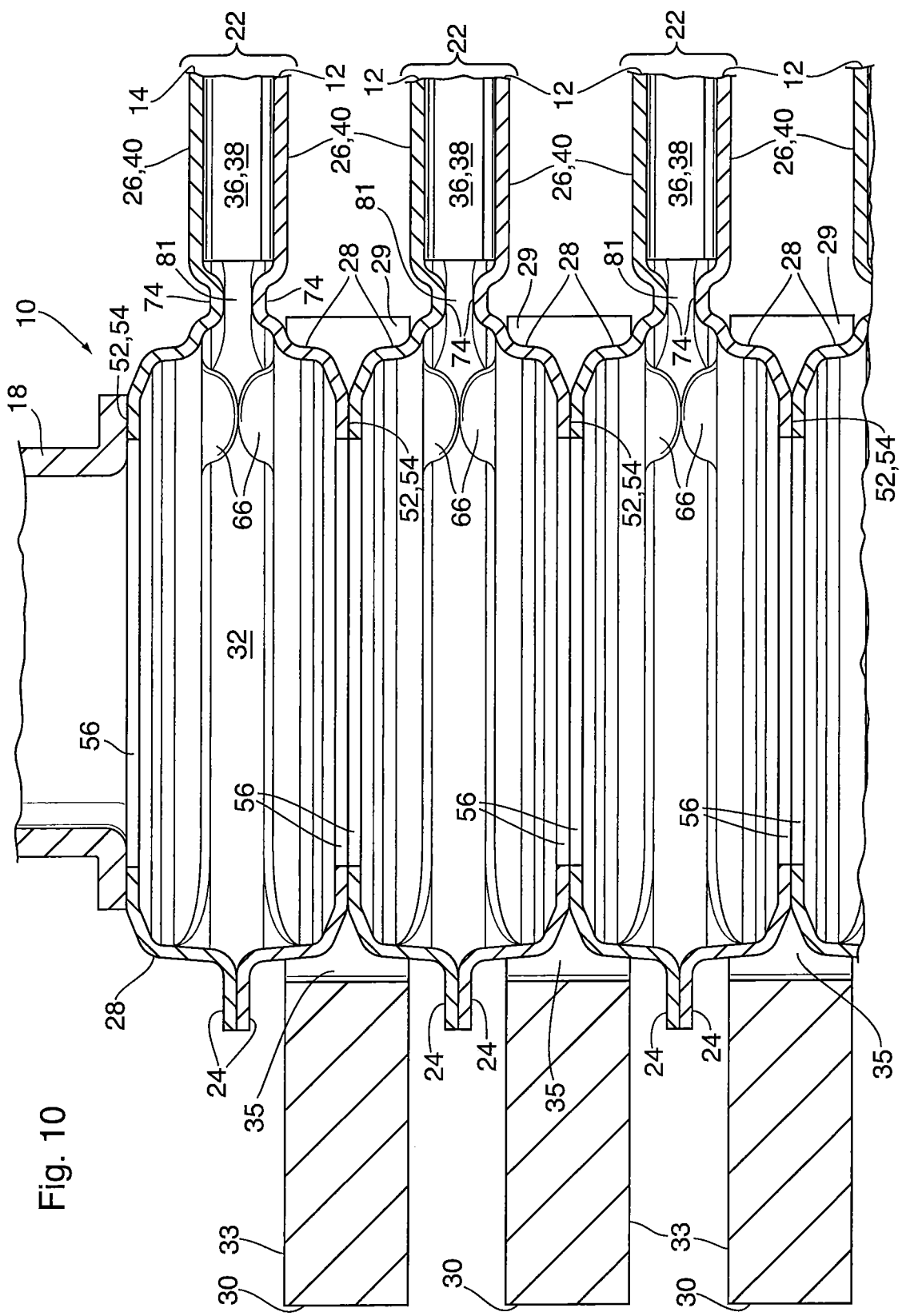
FIG. 10 is a partial longitudinal cross-section showing a plurality of compression fixtures applied to one end of the heat exchanger according to the first embodiment.
Figure 11:
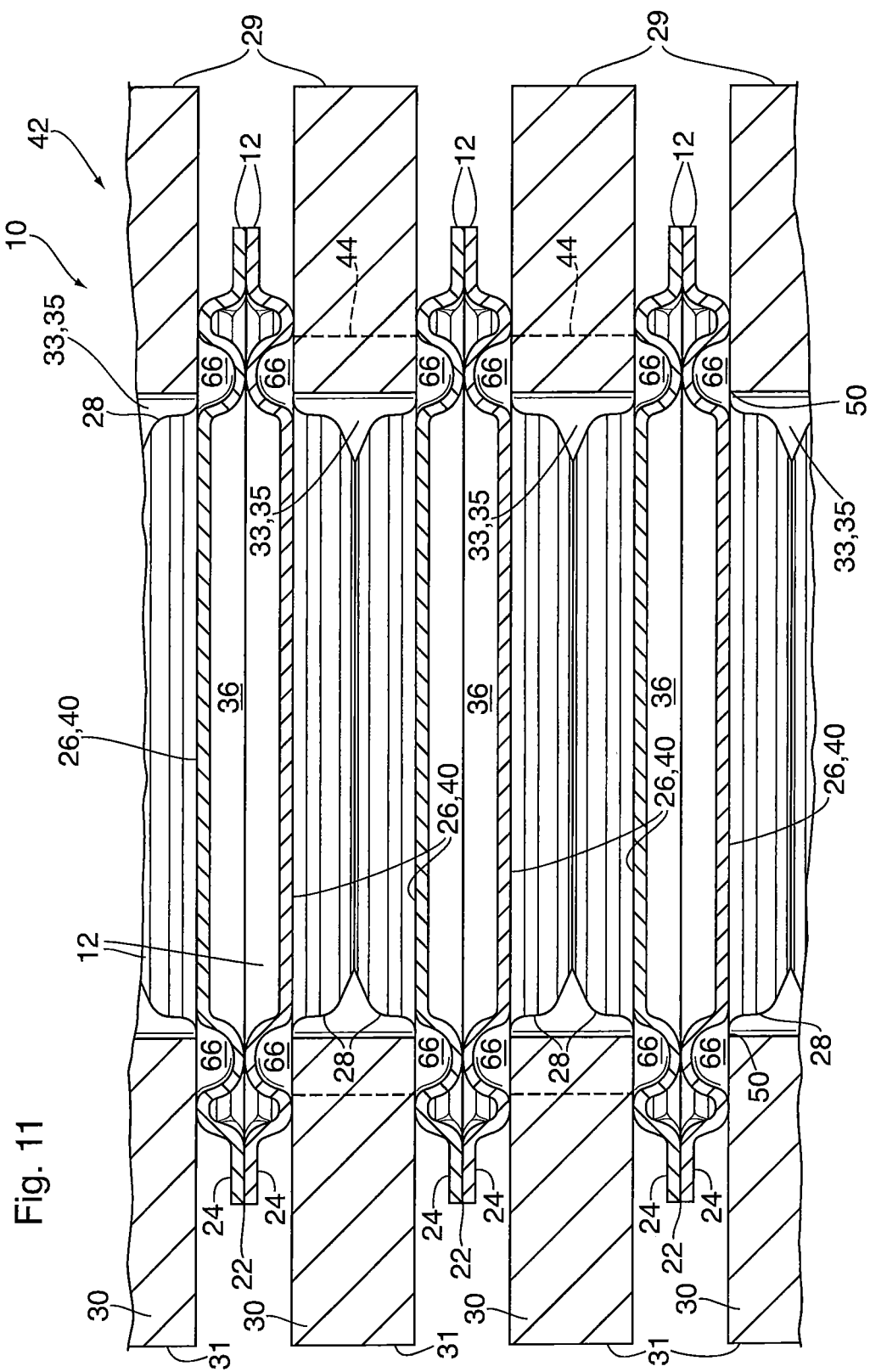
FIG. 11 is a partial transverse cross-section showing a plurality of compression fixtures applied to one end of the heat exchanger according to the first embodiment.
Figure 12:
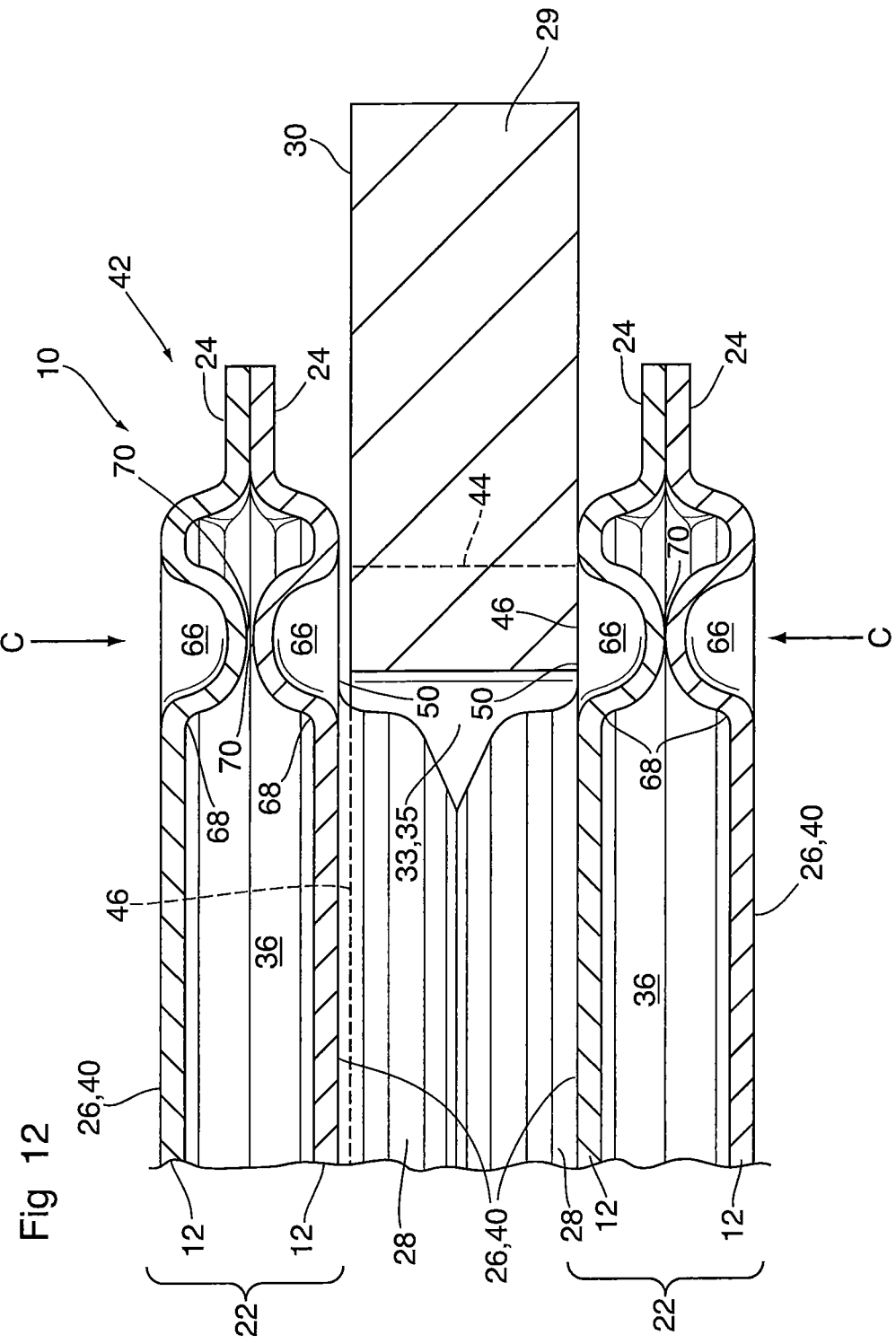
FIG. 12 is a close-up of a portion of FIG. 11, showing the cooperation between the compression fixtures and the protrusions of the core plates during compression.
Figure 13:
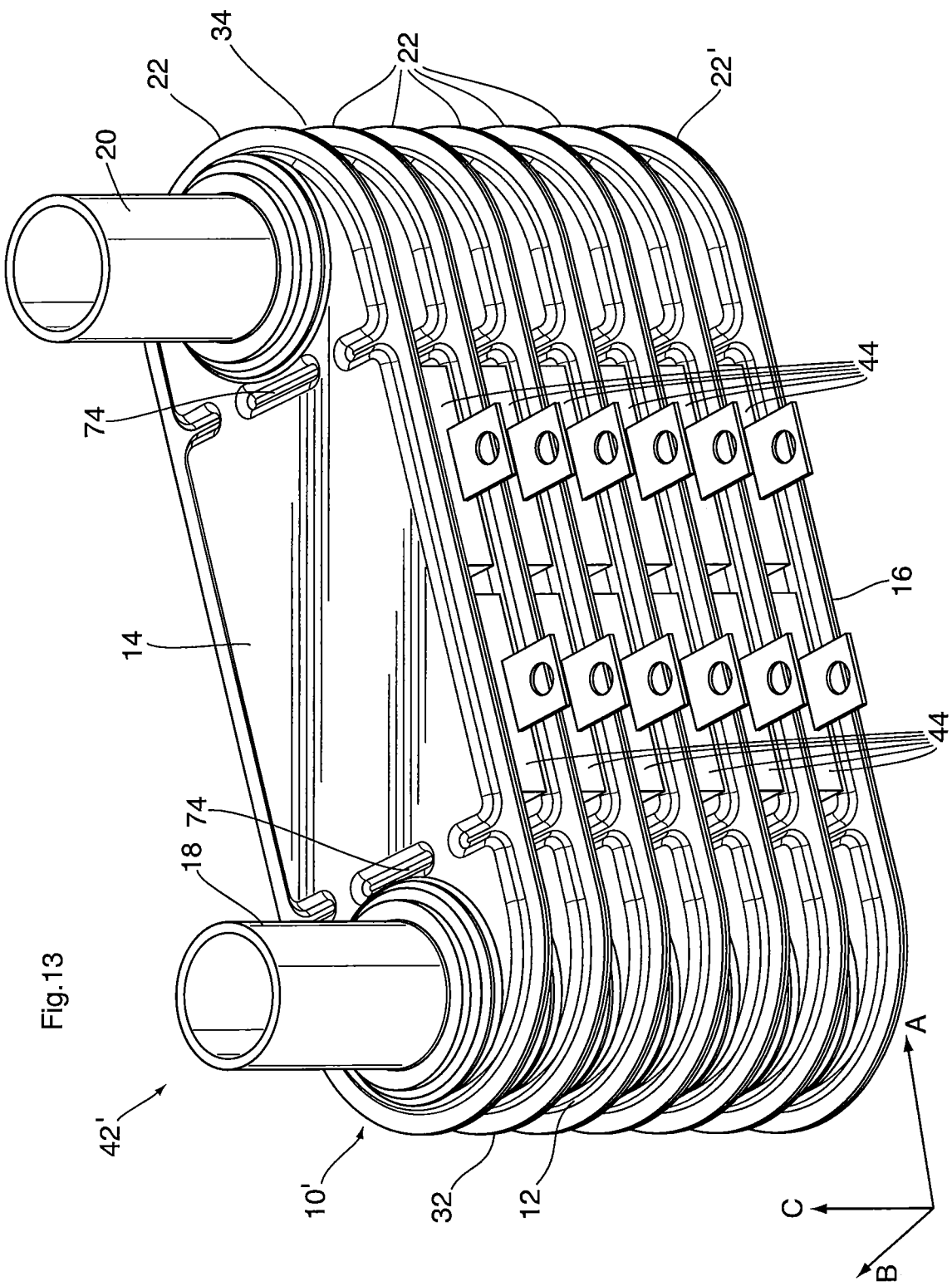
FIG. 13 is a top perspective view of a heat exchanger module according to a second embodiment.

As shown in FIGS. 10-12, the compression fixtures 30 surround the raised bosses 28 along three sides and prevent unwanted deformation of the core plates 12, 14 during the compression step. FIG. 10 is a longitudinal cross-section along a central plane, showing the fixtures 30 in their installed positions, with the leg 29 extending longitudinally along the sides of the bosses 28, and with the end portion 33 extending transversely across the end of the heat exchanger. FIG. 11 is a transverse cross-section along a plane which passes through the protrusions 66 of the core plates 12. FIG. 11 shows the post-compression configuration of the heat exchanger module 42, with the edges of the heat-generating electronic components 44 being shown by dotted lines. From FIG. 11 it can be seen that the thickness of the fixtures 30 is substantially the same as the thickness of the heat-generating electronic components 44, and each fixture 30 and component 44 is in contact with the raised portions 26 of a pair of adjacent flat tubes 22. It can further be seen that the fixtures 30 are in supporting engagement with the raised portions 26 and with the bases 50 of the bosses 28 along the inner peripheral edges of the U-shaped cutout 35.

FIG. 12 shows a compression fixture 30 having the same height as a heat-generating component 44 and being inserted between the edges of two flat tubes 22 of the brazed heat exchanger core, prior to compression of the core in the direction of the arrows. As in FIG. 7, it can be seen that there is a small gap between the upper surfaces of the compression fixture 30 and heat-generating component 44 and the raised portion 26 of the upper flat tube 22. As discussed above with reference to FIG. 8, the compression of heat exchanger 10 brings the heat transfer surfaces 40 of the flat tubes 22 into contact with the side surfaces 46 of the heat-generating component 44. Because the heat-generating component 44 and the compression fixture 30 in FIG. 12 have the same height, the maximum amount of deformation which will be permitted by the compression fixtures 30 is that which will bring the heat transfer surfaces 40 into contact with the side surfaces 46 of the heat-generating component 44, and further deformation and/or compression is prevented by the presence of the compression fixtures 30. One the compressing operation is finished, the fixtures 30 are removed.

It will be noted from FIGS. 11 and 12 that the legs 29, 31 of the compression fixtures 30 are vertically aligned (along axis C) with the protrusions 66 in the core plates 12, 14. The protrusions 66 support the walls of the raised portion 26 to prevent deformation of the flat tubes 22 in the areas surrounding the bosses 28. As shown in FIG. 12, the protrusions 66 in the top flat tube 22 have their top surfaces slightly spaced apart prior to compression of the heat exchanger 10. It can be expected that the protrusions 66 will be brought into contact with another during compression. In contrast, as can be seen from the lower flat tube 22 in FIG. 12, the protrusions 66 may already be in contact with each other prior to compression, and may be joined together by brazing.

The core plates 12, 14, 16 also include one or more features to optimize the flow distribution amongst the plurality of fluid flow passages 36 of heat exchanger 10, and also to optimize flow distribution within the individual fluid flow passages 36, while minimizing bypass flow. It will be appreciated that the fluid flow passages 36 of heat exchanger 10 are arranged in parallel, such that the fluid flow distribution to each passage 36 will depend on the relative pressure drops of the manifolds 32, 34 and the individual fluid flow passages 36. Owing to the relatively square or rectangular geometry of heat-generating electronic components 44, and the limited number of heat-generating electronic components 44 in each layer, the fluid flow passages of heat exchangers of the type described herein have a relatively short length dimension (along axis A). For example, in heat exchanger 10, the length of the fluid flow passages 36 will typically be from about 1-4 times their width. Due to the geometry of the fluid flow passages 36, the inventors have found that the pressure drops of the fluid flow passages 36 relative to the pressure drop of the manifolds 32, 34 may be insufficient to maintain a uniform distribution of cooling fluid throughout the fluid flow passages 36 of heat exchanger 10. For this reason, the heat exchanger 10 also includes one or more flow distribution features to control the pressure drop within each fluid flow passage 36 and thereby optimize the fluid flow distribution to the fluid flow passages 36.

The inventors have also found that increasing the pressure drop within the fluid flow passages 36 may result in higher bypass flow, for example through narrow bypass channels 72 extending from the inlet manifold 32 to the outlet manifold 34 and located between the longitudinal edges (along axis A) of the turbulence-enhancing inserts 38 and outer edges 6, 8 of the fluid flow passages 36. This increased bypass flow through channels 72 has a negative effect on the efficiency of the heat exchanger 10. Therefore, the flow distribution features described herein are configured to also minimize the amount of bypass flow through the channels 72 at the outer edges 6, 8 of the fluid flow passages 36, resulting in more effective cooling of the heat-generating components 44.

In the present embodiment, the heat exchanger assembly 10 further comprises flow distribution features comprising one or more flow-restricting ribs 74 arranged within at least some of the fluid flow passages 36 to partially block fluid flow between at least one of the manifolds 32, 34 and the heat transfer area 76 by reducing the height of the fluid flow passage 36 outside the heat transfer area 76, along at least a portion of the width of the fluid flow passage 36. Each of the one or more flow-restricting ribs 74 extends from the top wall 2 or bottom wall 4 of flat tube 22. For example, within any one of the fluid flow passages 36, the one or more flow-restricting ribs 74 reduces the height of the fluid flow passage 36 along at least a portion of the width of the fluid flow passage 36 between at least one of the manifolds 32, 34 and the heat transfer area 76.

As mentioned above, the core plates 12, 14 of heat exchanger 10 are identical to one another, and therefore all have the same configuration of flow restricting ribs 74. Although the bottom plate 16 lacks raised apertured bosses 28 it may also have the same configuration of flow restricting ribs 74 as core plates 12, 14. The flow-restricting ribs 74 are formed in the raised portion 26 of core plate 12, 14, 16, and extend from the underside of the core plate 12, 14, 16, i.e. in a direction opposite to the direction in which the raised bosses 28 extend from the top of the core plate 12, 14, 16. Each flow-restricting rib 74 has a height defined as a distance between the base 78 and the top surface 80 thereof.

In the present embodiment, each of the core plates 12, 14, 16 is provided with a first flow restricting rib 74 between the inlet manifold 32 and the heat transfer area 76, and a second flow restricting rib 74 is provided between the outlet manifold 34 and the heat transfer area 76. In some embodiments, a flow restricting rib 74 may be provided only between the inlet manifold 32 and the heat transfer area 76, or only between outlet manifold 34 and the heat transfer area 76. In other words, it is not essential that flow restricting ribs 74 are provided at both ends of the heat transfer area 76 in all embodiments. This will depend somewhat on the dimensions of the fluid flow passages 36, the amount of desired back pressure to be provided by ribs 74, and the resulting amount of bypass flow through bypass channels 72.

The flow restricting ribs 74 of core plates 12, 14, 16 are shown as extending along a transverse axis B, which is transverse to longitudinal axis A, although this may not be necessary in all embodiments. The transverse arrangement of flow restricting ribs 74 in the present embodiment allows the area of the heat transfer surface 40 to be maximized. In some embodiments, the flow restricting ribs 74 may be substantially or approximately transverse to the longitudinal axis A, and/or may be angled relative to the longitudinal axis A.

The flow restricting ribs 74 in the present embodiment are "reduced-height" ribs along their entire lengths, meaning that the top surfaces 80 of the ribs 74 are lower than the peripheral flange 26. Accordingly, when the core plates 12, 14, 16 are assembled into flat tubes 22, the top surfaces 80 of the ribs 74 in the opposed core plates 12, 14, 16 of each flat tube 22 are spaced from one another so as to provide a fluid flow gap 81, as can be seen in FIGS. 2, 5, 7 and 8.

FIGS. 13-16 illustrate a heat exchanger module 42' including a heat exchanger 10' according to a second example embodiment. Heat exchanger 10' differs from heat exchanger 10 in that it lacks protrusions 66 and in that the ribs 74 are of a different configuration from those of heat exchanger 10. All other elements of heat exchanger 10' are identical to those of heat exchanger 10. These elements are identified by like reference numerals and the above description of these like elements in connection with heat exchanger 10 applies equally to heat exchanger 10'.

The core plates 12, 14, 16 of heat exchanger 10' also include a pair of flow-restricting ribs 74 located at opposite ends of the heat transfer area 76. The ribs 74 of heat exchanger 10' are "full-height" ribs, meaning that they have a maximum height, defined as a distance between the base 78 and the top surface 80 thereof, such that the top surface 80 is substantially coplanar with the peripheral flange 24 of the core plate 12, 14, 16. Accordingly, when the core plates 12, 14, 16 are assembled into flat tubes 22, the top surfaces 80 of the ribs 74 in one core plate 12, 14, 16 will be in contact with, and may be brazed to, the ribs 74 of the other core plate 12, 14, 16 forming the flat tube 22, as can be seen from FIG. 12.

Each rib 74 may either extend continuously between the peripheral flange 24 at opposite sides of the core plate 12, 14, 16, as in heat exchanger 10, or the rib 74 may be interrupted by one or more gaps 82 in which the height of rib 74 is less than its full height, or in which the height of rib 74 is reduced to zero. In heat exchanger 10', each rib 74 has two gaps 82 in which the height of the rib 74 is zero, i.e. the rib is not formed in the area of gaps 82, and the gaps 82 are therefore co-planar with the underside of raised portion 26. The two gaps 82 in the present embodiment are spaced inwardly from the peripheral flange 24 by a substantially equal amount, leaving a central rib segment 74a and two edge segments 74b and 74c.

Figure 14:
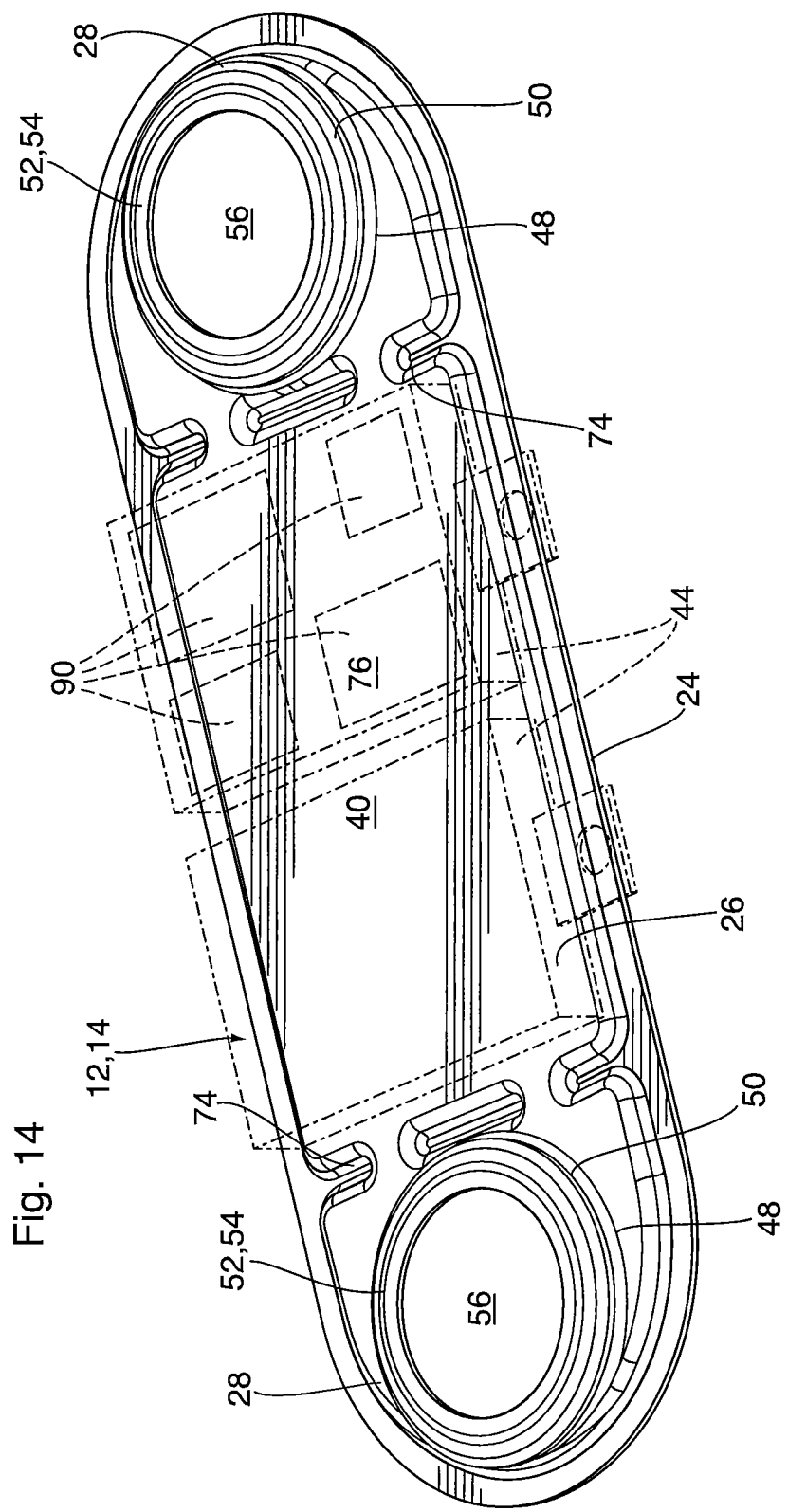
FIG. 14 is a top perspective view of a core plate of the heat exchanger module of FIG. 13.
Figure 15:
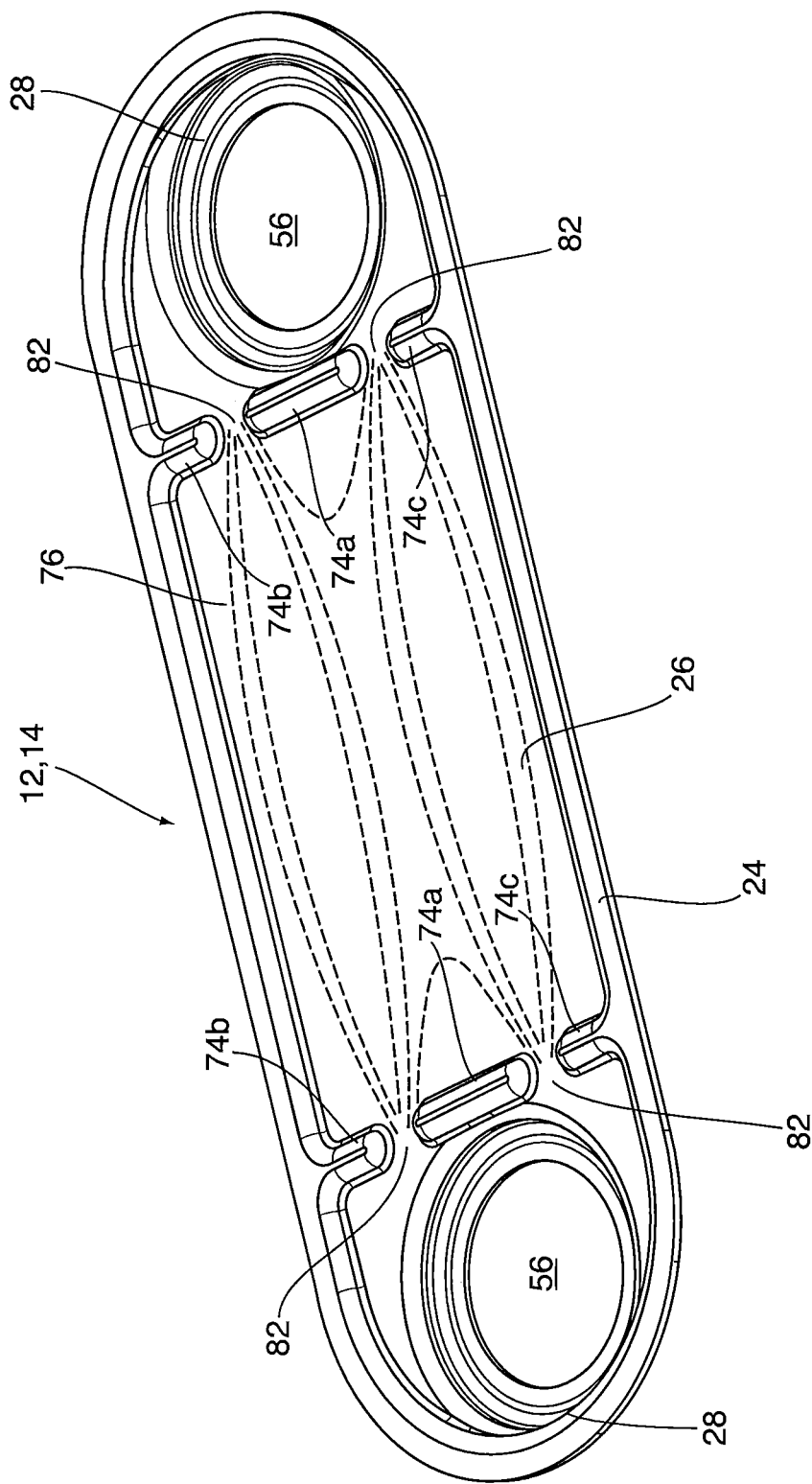
FIG. 15 is a bottom perspective view of a core plate of the heat exchanger module of FIG. 13.
Figure 16:
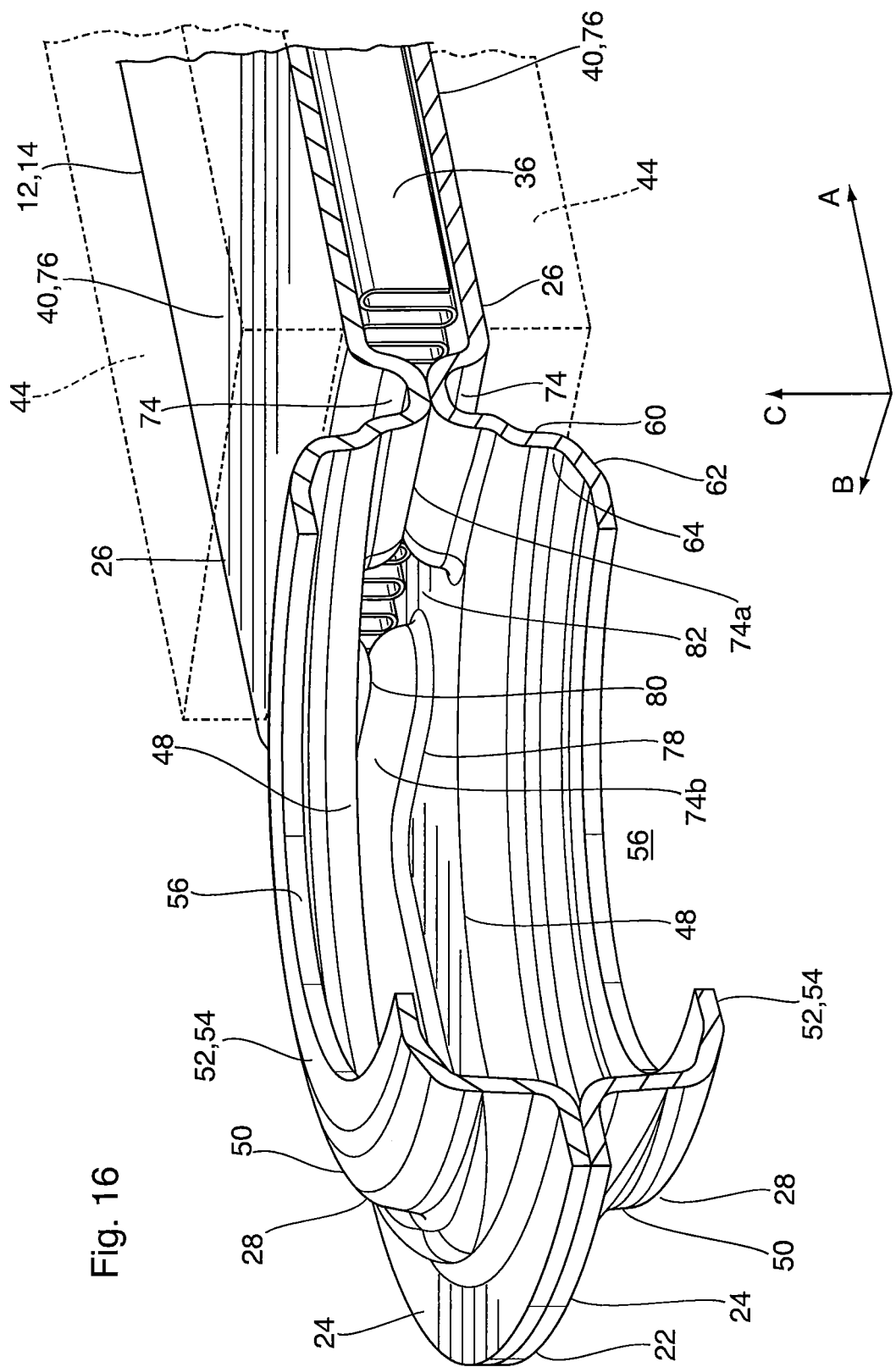
FIG. 16 is a partial longitudinal cross-section through a plate pair of the heat exchanger module of FIG. 13.

As shown in FIG. 15, the resulting distribution of fluid flow is concentrated in the central portions of the core plate 12, 14, 16 and the resulting flat tube 22, with areas of higher flow being shown as lighter areas. It can be seen from FIG. 15 that the flow of cooling fluid is diverted away from the edges of the fluid flow passage 36 at which the bypass channels 72 exist, and is caused to flow through the turbulence-enhancing insert 38 in heat transfer area 76, resulting in optimal heat transfer between the heat-generating electronic components 44 and the heat transfer fluid. Furthermore, the approximate locations of the IGBTs and/or diodes 90 embedded within one of the heat-generating electronic components 44 are indicated in FIG. 14 by squares of different sizes within the heat transfer area 76. It will be appreciated that these squares indicate "hot spots", i.e. areas of higher heat generation, and therefore the flow distribution provided by the rib configuration of heat exchanger 10' is advantageous as it concentrates the flow of cooling fluid to these hot spots.

Figure 17:
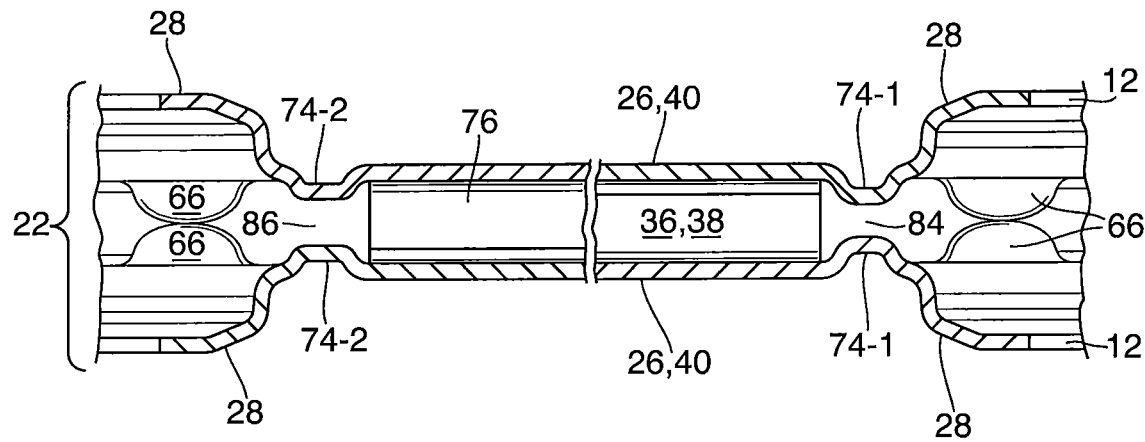
FIG. 17 is a partial longitudinal cross-section through a plate pair of a heat exchanger module having an alternate flow-restricting rib configuration.
Figure 18:
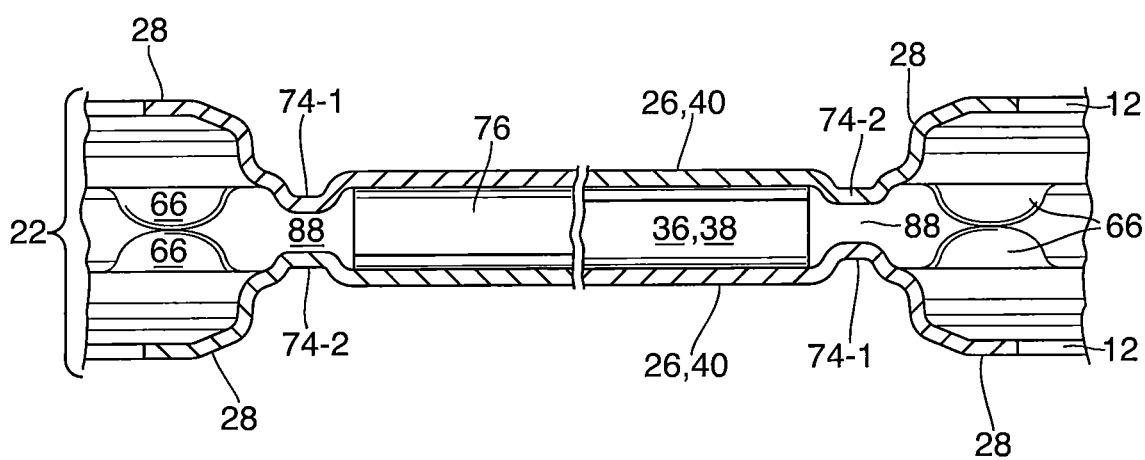
FIG. 18 is a partial longitudinal cross-section through a plate pair of a heat exchanger module having an alternate flow-restricting rib configuration.

There are numerous other configurations of flow-restricting ribs 74 which may be used to alter the flow distribution in specific applications. For example, FIGS. 17 and 18 show a flat tube 22 made up of two identical core plates 12, in which the heights of the flow-restricting ribs 74 at the opposite ends of each core plate 12 are different. In this regard, each core plate 12 in FIGS. 17 and 18 is provided with "reduced-height" ribs 74 at both ends of the heat transfer area 76, wherein the rib 74 (identified as 74-1) at one end of the heat transfer area 76 has a first height and the rib 74 (identified as 74-2) at the other end of the heat transfer area 76 has a second height, the first height being greater than the second height.

In the configuration shown in FIG. 17, the flat tube 22 is assembled with higher rib 74-1 in one core plate 12 being opposed to the higher rib 74-1 in the facing core plate 12, such that a small gap 84 is located at one end of the heat transfer area 76. Also, the lower rib 74-2 in one core plate 12, 14, 16 is opposed to the lower rib 74-2 in the facing core plate 12, 14, 16, such that a large gap 86 is located at the opposite end of the heat transfer area 76. The small gap 84, whether located proximate to the inlet or outlet manifold 32, 34, results in a relatively high back pressure which may be desired in some applications.

FIG. 18 illustrates an alternate configuration in which the higher rib 74-1 in each core plate 12, 14, 16 is opposed to the lower rib 74-2 in the facing core plate 12, 14, 16, such that an intermediate gap 88 (i.e. larger than gap 84 and smaller than gap 86) is provided at both ends of the heat transfer area 76. This provides a relatively low pressure drop as compared to the flat tube configuration in FIG. 17. It will be appreciated that the use of flow-restricting ribs 74 of different heights at the opposed ends of the heat transfer area 76 will permit some variability in the back pressure in different fluid flow passages 36 of heat exchanger 10, while permitting all the core plates 12, 14, 16 to be identical and/or to have an identical configuration of ribs 74. In this regard, one can select the configurations in either FIG. 17 or 18 simply by rotating one of the core plates 12 about a vertical axis.

Figure 19:
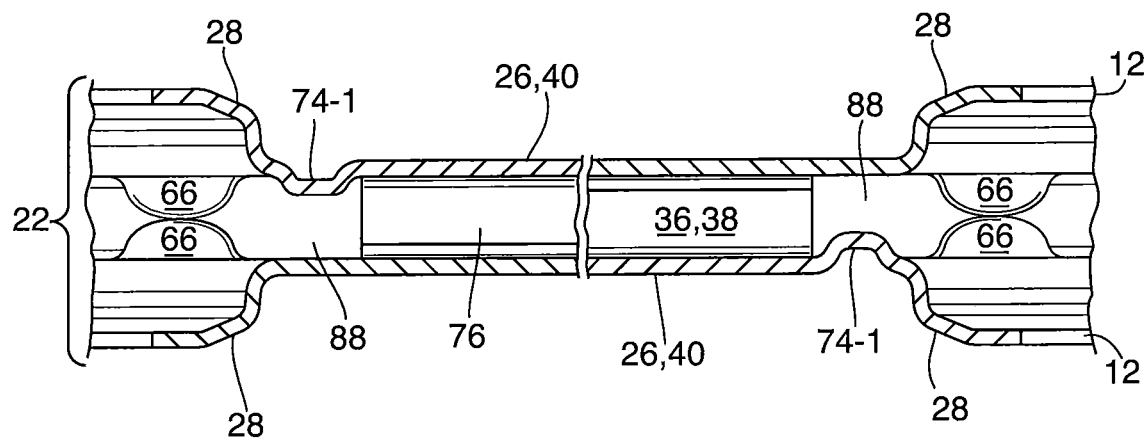
FIG. 19 is a partial longitudinal cross-section through a plate pair of a heat exchanger module having an alternate flow-restricting rib configuration.
Figure 20:
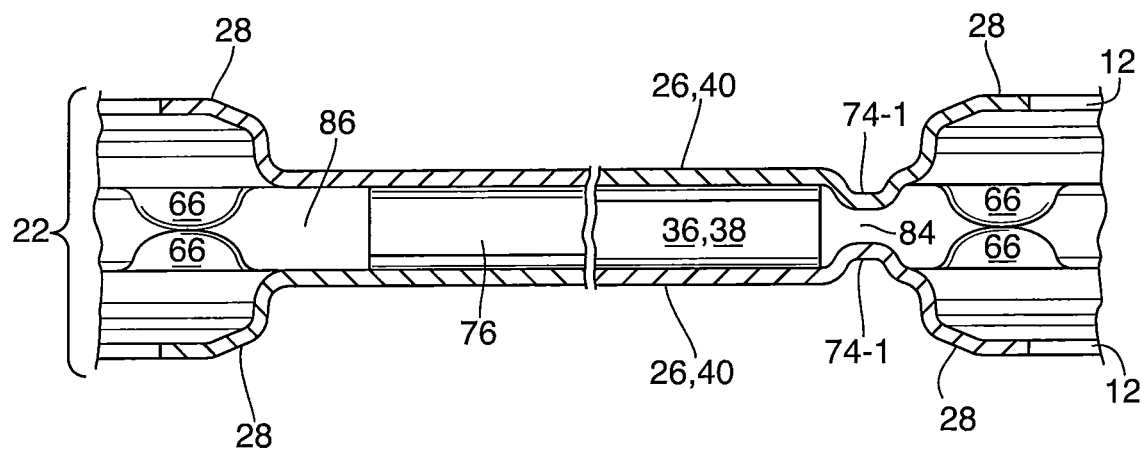
FIG. 20 is a partial longitudinal cross-section through a plate pair of a heat exchanger module having an alternate flow-restricting rib configuration.

It will be appreciated that it is possible to introduce variable back pressure into the fluid flow passages 36 of heat exchanger 10 in other ways. For example, a reduced-height or full-height rib 74 may be provided at one end of the heat transfer area 76 of each core plate 12, 14, 16, while no rib 74 is provided at the opposite end. FIGS. 19-20 show a configuration in which each core plate 12 includes a reduced height flow-restricting rib 74-1 at one end (identical to rib 74-1 in FIGS. 17-18), and with no flow restricting rib 74 at the opposite end. In this configuration, the lower rib 74-2 of FIGS. 17-18 is completely eliminated, such that each core plate 12 has only a single flow-restricting rib 74-1 which may be positioned at either the inlet or outlet end of the core plate 12. The effect of eliminating lower rib 74-2 is that large gap 86 (FIG. 20) will be the full height of the fluid flow passage 36, while intermediate gap 88 (FIG. 19) will be higher by an amount equal to the height of the missing lower rib 74-2.

Figure 21:
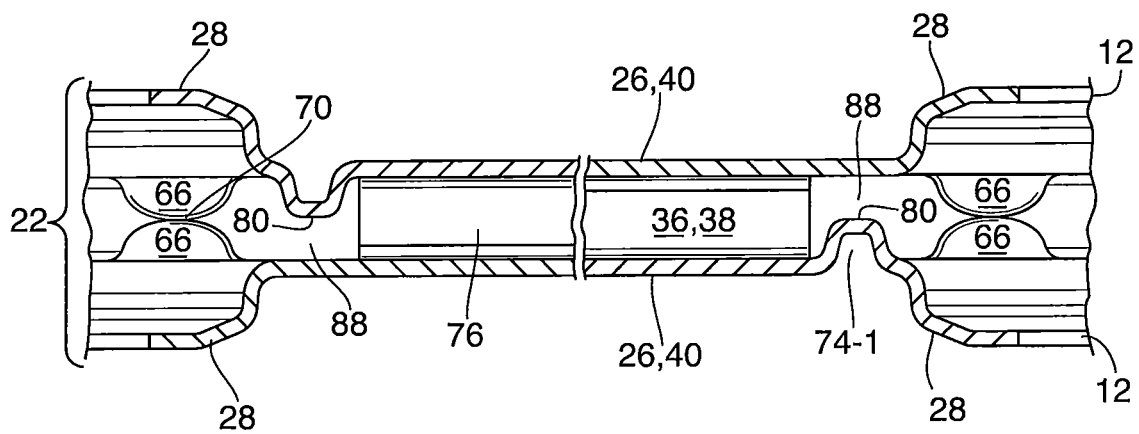
FIG. 21 is a partial longitudinal cross-section through a plate pair of a heat exchanger module having an alternate flow-restricting rib configuration.

FIG. 21 illustrates a flat tube configuration identical to that of FIG. 19, except that the rib 74-1 is a full-height rib having a top surface 80 which is co-planar with the top surfaces 70 of the protrusions 66, which are co-planar with the sealing surface of peripheral flange 24 (not shown in FIG. 21). The height of the fluid flow gaps 88 in FIG. 21 is equal to half the maximum height of the fluid flow passage 36.

It will be appreciated that the ribs 74 in FIGS. 17-21 may be full height along parts of their length and reduced height along other parts of their length.

Figure 22:
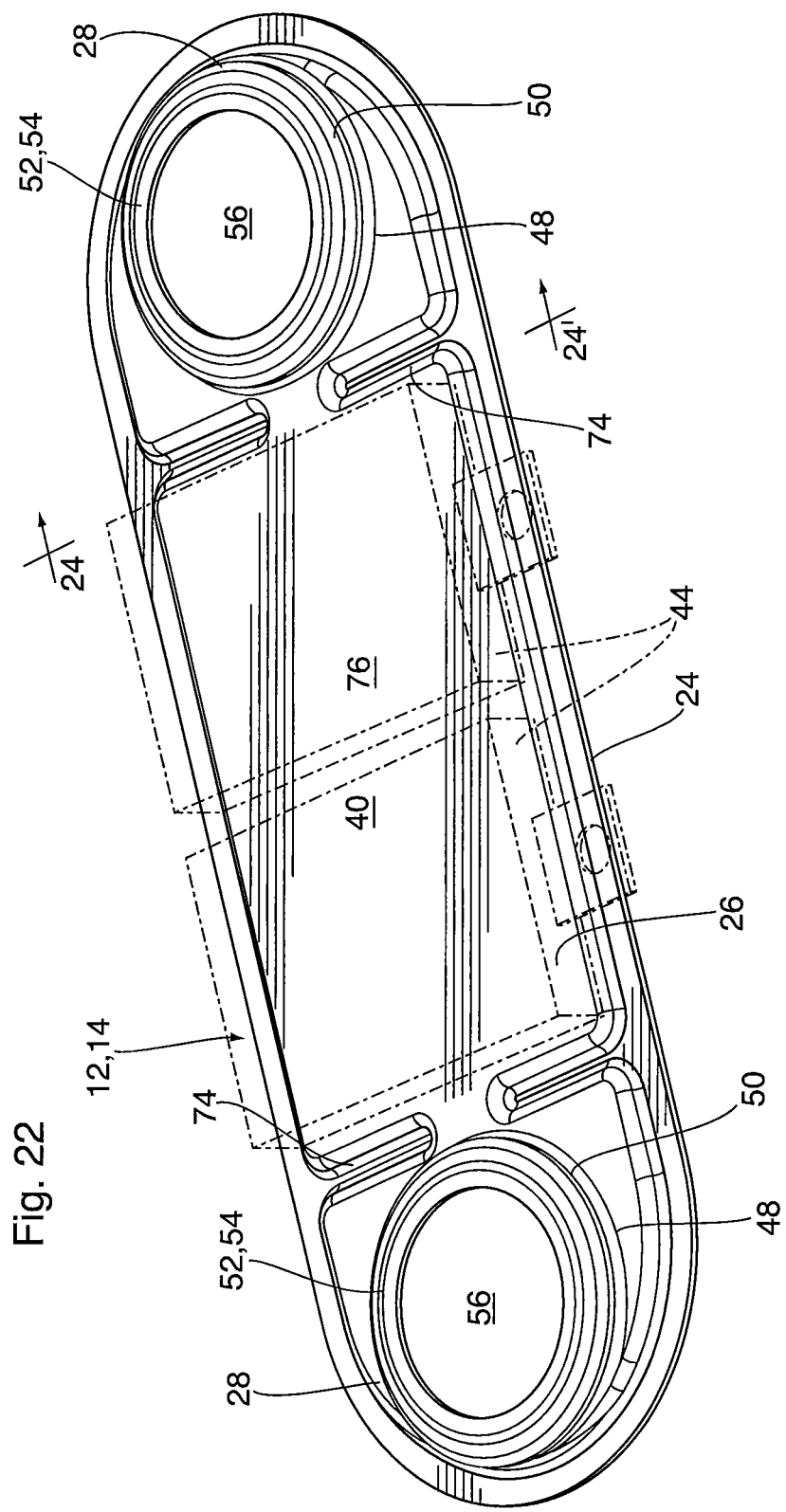
FIG. 22 is a top perspective view of a core plate of a heat exchanger module having an alternate flow-restricting rib configuration.
Figure 23:
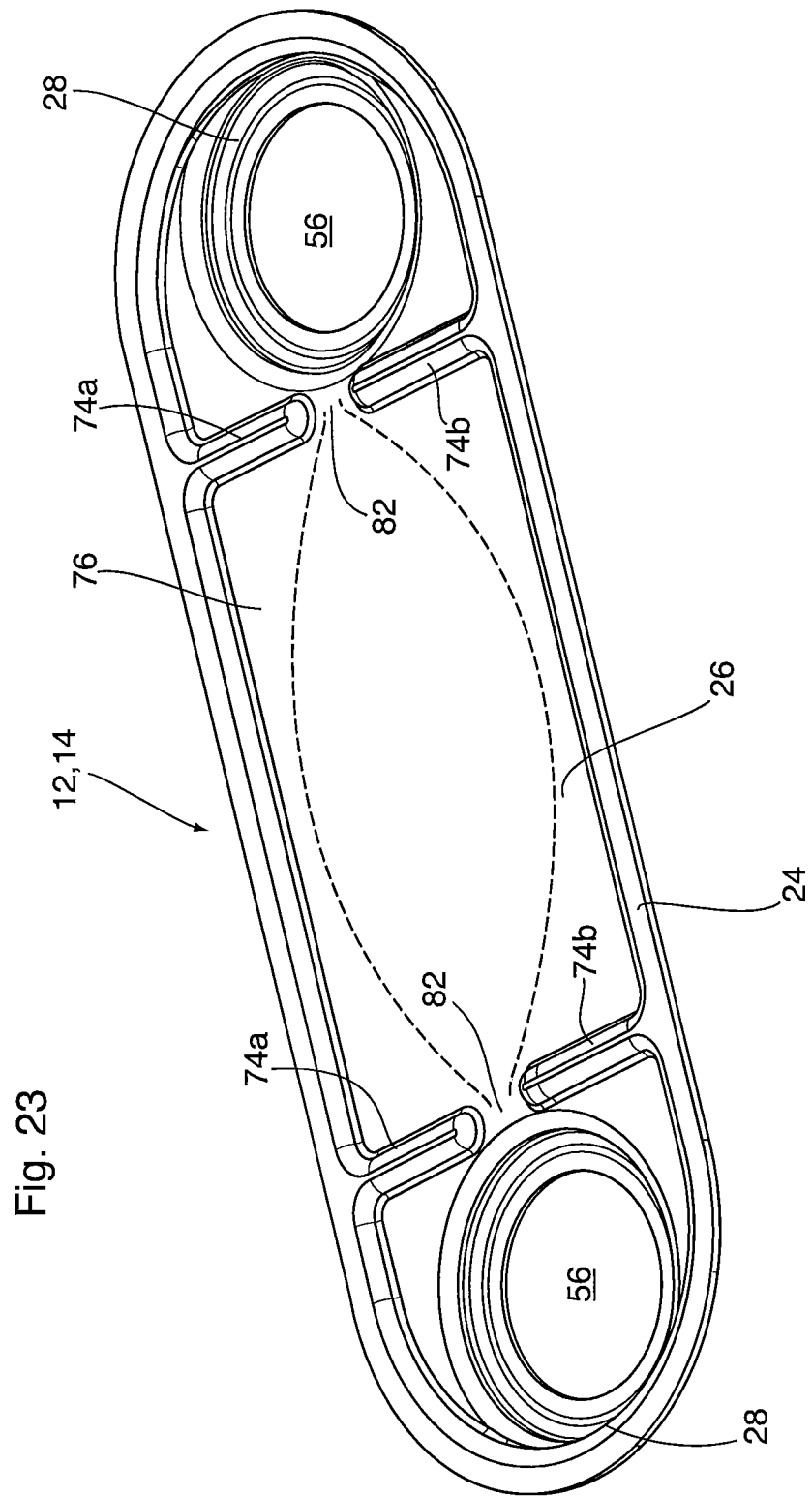
FIG. 23 is a bottom perspective view of the core plate of FIG. 23.
Figure 24:
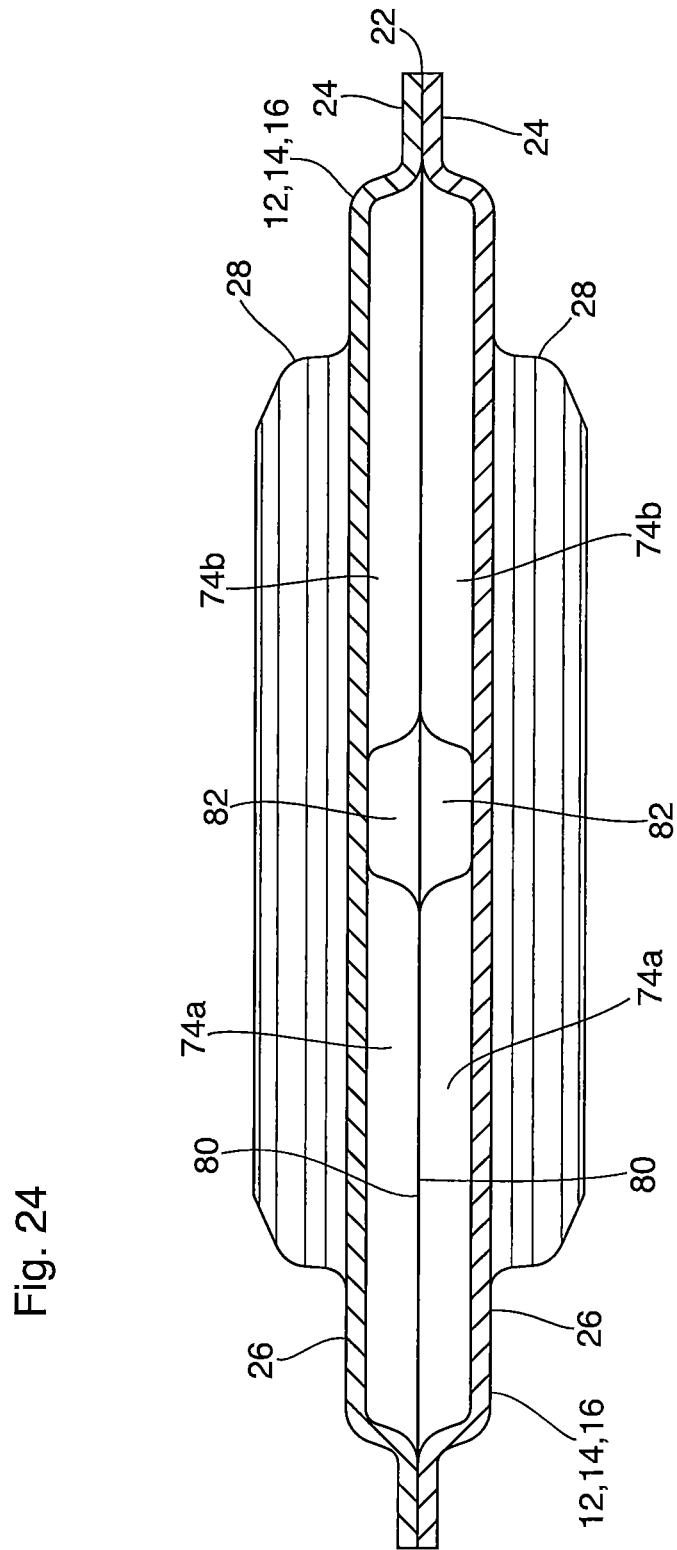
FIG. 24 is a partial transverse cross section through a plate pair having the flow-restricting rib configuration of FIGS. 22 and 23.
Figure 25:
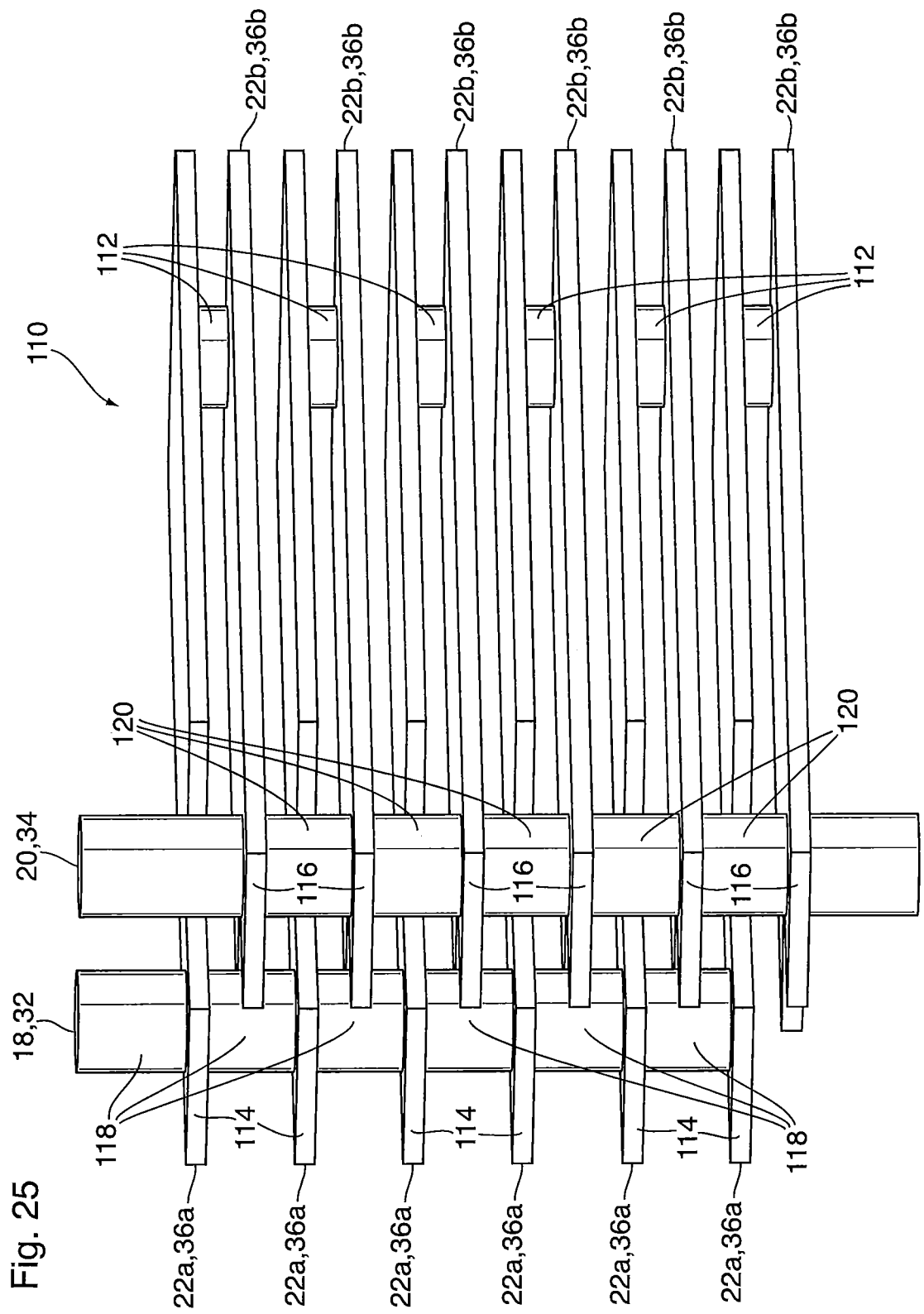
FIG. 25 is a side perspective view of a heat exchanger according to a third example embodiment.
Figure 26:
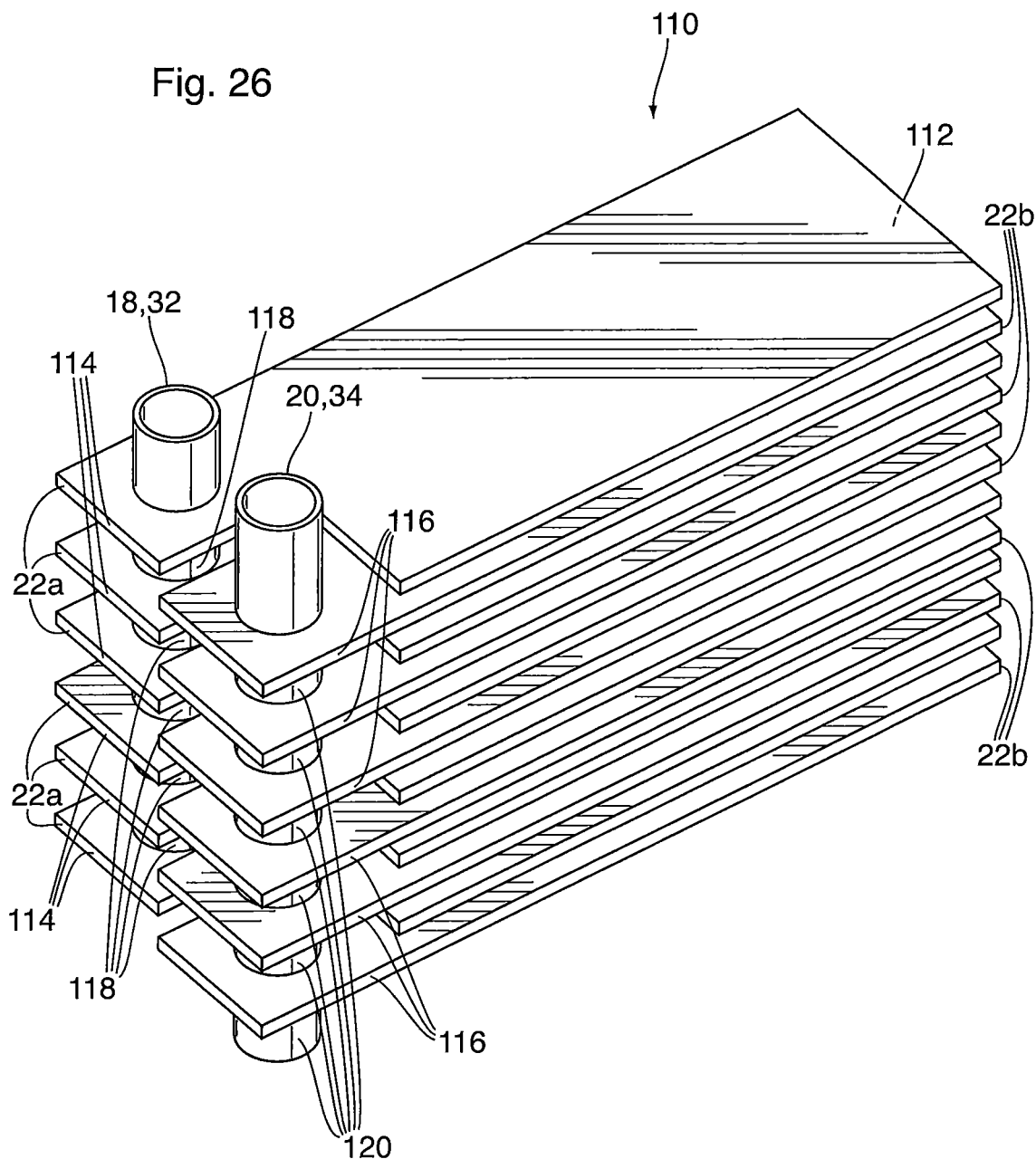
FIG. 26 is a front perspective view of the heat exchanger of FIG. 25.

FIGS. 22 to 24 show an alternate rib pattern which may be used in heat exchanger 10' and a flow distribution produced thereby. In this regard, the three-part flow-restricting rib 74 (comprising segments 74a, 74b, 74c) of heat exchanger 10' may be replaced by a full-height, two-part, flow-restricting rib 74, as shown in FIGS. 22-24, comprising full-height segments 74a and 74b separated by a centrally located gap 82. The gap 82 extends throughout the full height of fluid flow passage 38, the rib segments 74a, 74b extend inwardly from the outer edges of the plates 12, 14, 16, and the tops 80 of the rib segments 74a, 74b are sealingly joined together, for example by brazing. Therefore, the rib configuration of FIG. 22 causes all the fluid to be diverted through the centrally-located gap 82, resulting in a flow distribution as shown in dotted lines in FIG. 23, wherein the fluid is caused to flow through the middle area of plate 12, 14, 16, i.e. the area which will contain a turbulence-enhancing insert 38, while avoiding the edges of the plate 12, 14, 16, i.e. the areas of the bypass passages 72. It will be appreciated that one of the ribs 74 may be eliminated from either end of the heat transfer area in the embodiment of FIGS. 22-24.

A heat exchanger 110 according to a third embodiment is now described with reference to FIGS. 25 to 28. Heat exchanger 110 shares a number of common features with heat exchangers 10 and 10' described above, and like reference numerals are used to illustrate like elements. The above descriptions of the like elements of heat exchangers 10 and 10' apply equally to heat exchanger 110 unless otherwise stated below.

As can be seen from the drawings, the heat exchanger 110 has a U-flow configuration with the inlet and outlet fittings 18, 20 and manifolds 32, 34 located at the same end of the flat tubes 22. The flat tubes 22 of heat exchanger 110 are schematically shown in the drawings, but it will be appreciated that the flat tubes 22 may have a construction similar to that of heat exchangers 10, 10', comprising a pair of core plates brazed together in face-to-face relation along their peripheral flanges, with a turbulence-enhancing insert defining the heat transfer area of the flat tube 22.

Spaces for receiving heat-generating electronic components 44 (not shown) are defined between adjacent flat tubes 22 of heat exchanger 110. It can be seen that every second flat tube (labelled 22a) in heat exchanger 110 communicates only with the inlet manifold 32, while each of the other flat tubes (labelled 22b) communicates only with the outlet manifold 34. Therefore, each flat tube 22a (also referred to herein as an "inlet flat tube") defines an inlet fluid flow passage 36a while each flat tube 22b (also referred to herein as an "outlet flat tube") defines an outlet fluid flow passage 36b.

It can be seen that a tubular communication passage 112 is provided between each inlet flat tube 22a and an adjacent outlet flat tube 22b, the communication passage 112 being located at the ends of flat tubes 22a, 22b which are distal to the manifolds 32, 34.

In order to permit linear manifold connections throughout the height of heat exchanger 110, portions of the flat tubes 22a, 22b which form manifolds 32, 34 are located in projecting end portions of the flat tubes 22a, 22b. In particular, inlet flat tube 22a has a projecting end portion 114 projecting outwardly of the edges of outlet flat tubes 22b, so as to permit the inlet manifold 32 to extend vertically throughout the height of the heat exchanger 110. Similarly, the outlet flat tube 22b has a projecting end portion 116 projecting outwardly of the edges of the inlet flat tubes 22a, so as to permit the outlet manifold 34 to extend vertically throughout the height of the heat exchanger 110. In the drawings, the inlet and outlet flat tubes 22a, 22b are schematically shown as being flat, and being joined by tubular inlet and outlet communication passages 118, 120. However, it will be appreciated that the flat tubes 22a, 22b may instead be formed from stamped core plates similar to those described above, having raised apertured bosses which are joined together to form manifolds 32, 34 as discussed above with reference to heat exchanger 10. Similarly, the tubular communication passage 112 may be replaced by raised apertured bosses.

Figure 27:
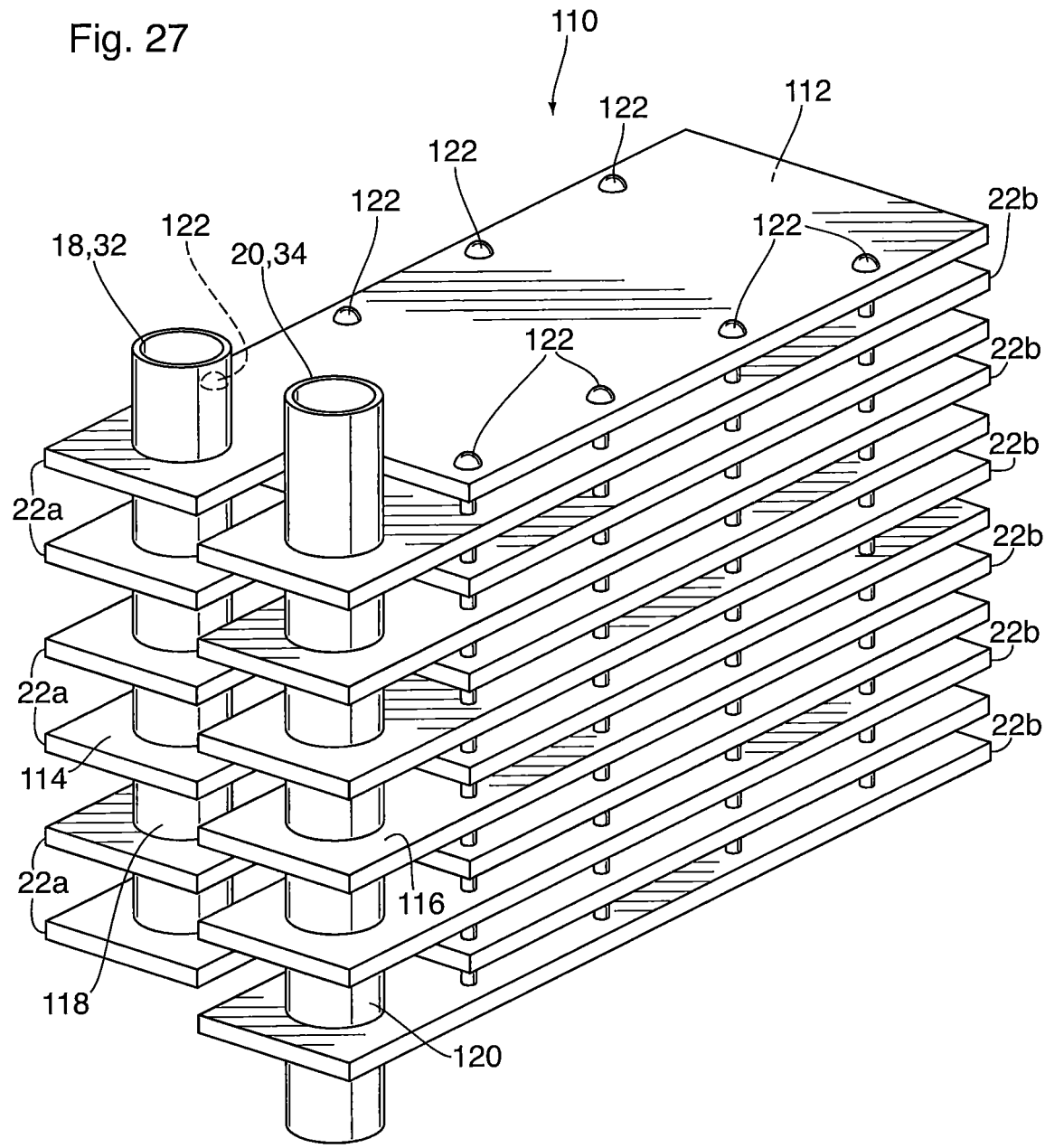
FIG. 27 is a side perspective view of the heat exchanger of FIG. 25 with the addition of tie rods.

As in heat exchangers 10 and 10' described above, heat exchanger 110 may be compressed in its height dimension in order to create intimate thermal contact between the flat tubes 22 and the heat-generating electronic components 44 to be inserted in the spaces between adjacent flat tubes 22 to form a heat exchanger module 42. As shown in FIG. 27, the edges of the flat tubes 22 may be provided with spaced apertures through which tie rods 122 may be provided. The tie rods 122 may have threaded ends provided with nuts or the like for compressing the stack of flat tubes 22 into thermal contact with the electronic components 44. For example, where heat exchanger 110 is constructed from flat tubes having peripheral flanges 24, as described above, the spaced apertures may be provided in the peripheral flanges 24.

The manifolds 32, 34 of heat exchanger 110 may also be provided with features which render them compressible in order to enhance thermal contact with the heat-generating electronic components 44. For example, where the flat tubes 22 are constructed from core plates as described above, having raised apertured bosses 28 rather than tubular communication passages 112, 118, 120, the bosses 28 may be constructed as described above with reference to heat exchanger 10, so as to render them compressible. Alternatively, where the heat exchanger 110 is constructed with communication passages 112, 118, 120 in the form of tubular conduits which are integrally formed with or brazed to the flat tubes 22 of heat exchanger 110, the tubular communication passages 112, 118, 120 may be constructed with height-adjustable sliding seals as shown in FIG. 28.

Figure 28:
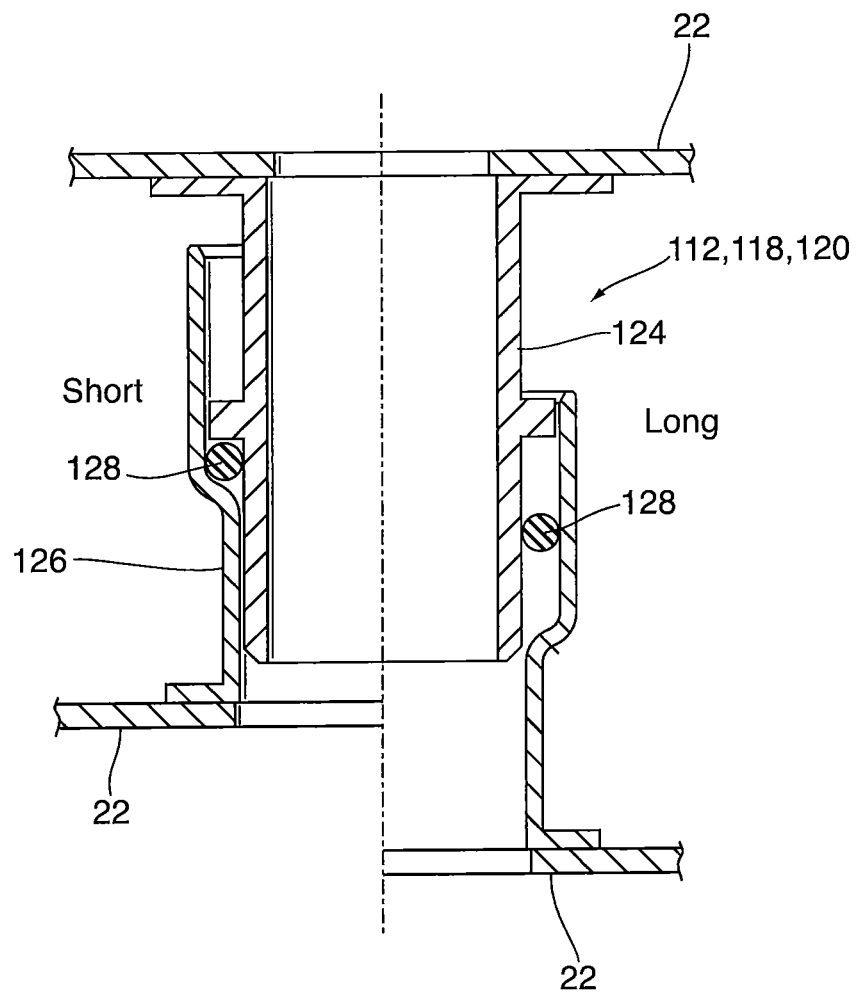
FIG. 28 is a cross-section of a sliding resilient seal for adjustably joining the plate pairs of the heat exchanger of FIG. 25.

As shown in FIG. 28, a tubular communication passage 112, 118, 120 between adjacent flat tubes 22 is constructed from first and second tubular segments 124, 126, each of which is secured to one of the flat tubes 22. The inside diameter of the second tubular segment 126 is greater than the outside diameter of the first tubular segment 124, and an annular resilient sealing member 128 is provided between the diameters of the first and second tubular segments 124, 126. The resilient sealing member 128 may be captured in a groove on the outer surface of the first tubular segment 124 or on the inner surface of the second tubular segment.

Where the tubular communication passage 112, 118, 120 are constructed in accordance with the sliding seal arrangement of FIG. 28, it will be appreciated that each flat tube 22 with its associated tubular segments 124, 126 will first be assembled by brazing. The resilient sealing members 128 will then be applied to the tubular segments 124 and/or 126, then the heat exchanger 110 will be assembled by inserting the first tubular segments 124 into the second tubular segments 126 so as to form the tubular communication passages 112, 118, 120, inserting the heat-generating electronic components 44 between the flat tubes 22, and finally compressing the flat tubes 22 into thermal contact with the electronic components 44, for example with tie rods 122 as shown in FIG. 27.

Although the invention has been described in connection with certain embodiments, it is not restricted thereto. Rather, the invention includes all embodiments which may fall within the scope of the following claims.

What is claimed is:

1. A heat exchanger assembly comprising:
a heat exchanger core comprising a plurality of flat tubes, wherein each said flat tube encloses an elongate fluid flow passage having a top wall, a bottom wall, and a pair of outer edges transversely spaced from one another, wherein a width of the fluid flow passage is defined between the outer edges;
wherein the flat tubes are arranged in a stack with the fluid flow passages in spaced parallel relation to one another along a height of the stack, such that a plurality of spaces for receiving heat-generating electronic components are defined between adjacent flat tubes, throughout the height of the stack, with the flat tubes defining heat transfer surfaces along which the flat tubes are adapted for thermal contact with the heat-generating electronic components;

wherein the flat tubes are joined together to form an inlet manifold and an outlet manifold, each of the manifolds extending throughout the height of the stack, with the inlet manifold being in direct flow communication with a first end of each said fluid flow passage and the outlet manifold being in direct flow communication with a second end of each said fluid flow passage;

wherein the fluid flow passage of each said flat tube has a heat transfer area located between the manifolds, wherein turbulence-enhancing inserts are provided inside the heat transfer area, and wherein the heat transfer area in each said fluid flow passage is directly opposite to at least one of said heat transfer surfaces on an outer surface of said flat tube, wherein the fluid flow passage has a maximum height between the top wall and the bottom wall in said heat transfer area, with the turbulence-enhancing inserts being in direct thermal contact with the top wall and the bottom wall;

wherein the heat exchanger assembly further comprises one or more flow-restricting ribs arranged within at least some of the fluid flow passages to partially block fluid flow between one of the manifolds and the heat transfer area by reducing the height of the fluid flow passage outside the heat transfer area, along at least a portion of the width of the fluid flow passage, and each flow-restricting rib positioned distal of one of the turbulence-enhancing inserts; and wherein each of the flat tubes comprises a pair of mating, elongate core plates having raised, apertured bosses at opposite ends of the elongate core plates, and wherein the raised, apertured bosses of the adjacent flat tubes are joined together so as to define the inlet manifold and the outlet manifold;

wherein the raised, apertured bosses have a height such that, prior to insertion of the heat-generating electronic components into spaces between the flat tubes, the height of each of the spaces is slightly greater than a thickness of one of the heat-generating electronic components, to permit the heat-generating electronic components to be inserted into the spaces between the heat transfer surfaces;

wherein the raised, apertured bosses each have a compressible sidewall region to permit the height of the spaces between the flat tubes to be reduced by application of a force along a compression axis parallel to the height of the manifolds;

wherein each elongate core plate further comprises one or more support protrusions, each of which is located in a substantially flat area proximate to a base of one of the raised, apertured bosses;

wherein each of the support protrusions extends from an underside of the core plate in a direction opposite to a direction in which the raised, apertured bosses extend from a top of the core plates; and wherein each of the support protrusions has a height defined as a distance between a base and a top surface thereof, the height being such that the top surface of the support protrusion is substantially coplanar with a peripheral flange of the core plate;

such that when the core plates are assembled to form said flat tubes, the support protrusions of one core plate of each said flat tube will be in contact with the support protrusions of another core plate forming the flat tube.

2. The heat exchanger assembly of claim 1, wherein the one or more flow-restricting ribs are arranged perpendicularly to flow passages of the turbulence-enhancing inserts.

3. The heat exchanger assembly of claim 1, wherein the one or more flow-restricting ribs in each said fluid flow passage reduces a height of the fluid flow passage across substantially its entire width, between at least one of the manifolds and the heat transfer area.

4. The heat exchanger assembly of claim 1, wherein each of the fluid flow passages has a length which is about 1-4 times its width, and wherein narrow bypass channels are present between longitudinal edges of the turbulence-enhancing inserts and the outer edges of the fluid flow passages.

5. The heat exchanger assembly of claim 4, wherein a first said flow-restricting rib is provided between two of the support protrusions and one of the turbulence-enhancing inserts.

6. The heat exchanger assembly of claim 4, wherein a first said flow-restricting rib is provided between a first and second of the support protrusions and a first of the turbulence-enhancing inserts, and a second said flow restricting rib is provided between a third and fourth of the support protrusions and the first of the turbulence-enhancing inserts.

7. The heat exchanger assembly of claim 5, wherein each said flow restricting rib extends transverse to a longitudinal axis of one of the turbulence-enhancing inserts.

8. The heat exchanger assembly of claim 4, wherein the outer edges of the fluid flow passages are located at peripheral flanges of the core plates, along which the core plates of each of the flat tubes are joined together;

wherein each said flow-restricting rib is a reduced-height rib along its entire length, wherein a top surface of each said rib is lower than the peripheral flange of the core plate in which it is formed;

such that when the core plates are assembled into said flat tubes, the top surfaces of the ribs in the opposed core plates of each said flat tube are spaced from one another so as to provide a fluid flow gap therebetween, wherein a height of the fluid flow gap is less than the maximum height.

9. A heat exchanger assembly, comprising:

a heat exchanger core comprising a plurality of flat tubes, wherein each said flat tube encloses an elongate fluid flow passage having a top wall, a bottom wall, and a pair of outer edges transversely spaced from one another, wherein a width of the fluid flow passage is defined between the outer edges;

wherein the flat tubes are arranged in a stack with the fluid flow passages in spaced parallel relation to one another along a height of the stack, such that a plurality of spaces for receiving heat-generating electronic components are defined between adjacent flat tubes, throughout the height of the stack, with the flat tubes defining heat transfer surfaces along which the flat tubes are adapted for thermal contact with the heat-generating components;

wherein the flat tubes are joined together to form an inlet manifold and an outlet manifold, each of the manifolds extending throughout the height of the stack, with the inlet manifold being in direct flow communication with a first end of each said fluid flow passage and the outlet manifold being in direct flow communication with a second end of each said fluid flow passage;

wherein the fluid flow passage of each said flat tube has a heat transfer area located between the manifolds, wherein turbulence-enhancing inserts are provided inside the heat transfer area, and wherein the heat transfer area in each said fluid flow passage is directly opposite to at least one said heat transfer surface on an outer surface of said flat tube, wherein the fluid flow passage has a maximum height between the top and bottom walls in said heat transfer area, with the turbulence-enhancing inserts being in direct thermal contact with the top and bottom walls;

wherein the heat exchanger assembly further comprises one or more flow-restricting ribs arranged within at least some of the fluid flow passages to partially block fluid flow between at least one of the manifolds and the heat transfer area by reducing the height of the fluid flow passage outside the heat transfer area, along at least a portion of the width of the fluid flow passage;

wherein each of the flat tubes comprises a pair of mating, elongate core plates having raised, apertured bosses at their opposite ends, wherein the raised, apertured bosses of the adjacent flat tubes are joined together so as to define the inlet manifold and the outlet manifold, and wherein central portions of the pair of mating core plates define the top and bottom walls of each said flat tube;

wherein the raised, apertured bosses have a height such that, prior to insertion of the heat-generating electronic components into spaces between the flat tubes, the height of each of the spaces is slightly greater than a thickness of one of the heat-generating electronic components, to permit the heat-generating electronic components to be inserted into the spaces between the heat transfer surfaces;

wherein the raised, apertured bosses each have a compressible sidewall region to permit the height of the spaces between the flat tubes to be reduced by application of a force along a compression axis parallel to the height of the manifolds;

wherein each of the core plates further comprises one or more support protrusions, each of which is located in a substantially flat area proximate to a base of one of the raised, apertured bosses;

wherein each of the support protrusions extends from an underside of the core plate in a direction opposite to a direction in which the raised, apertured bosses extend from a top of the core plate; and wherein each of the support protrusions has a height defined as a distance between a base and a top surface thereof, the height being such that the top surface of the support protrusion is substantially coplanar with the peripheral flange of the core plate;

such that when the core plates are assembled to form said flat tubes, the support protrusions of one core plate of each said flat tube will be in contact with the support protrusions of the other core plate forming the flat tube.

10. The heat exchanger assembly of claim 9, wherein the support protrusions are in the form of circular dimples, each of which is located immediately adjacent to the base of one of the raised bosses.

11. A heat exchanger module comprising the heat exchanger assembly of claim 9 and a plurality of said heat-generating components;

the heat exchanger module further comprising a plurality of rigid compression fixtures for application to the heat exchanger module during assembly thereof, and prior to a step of applying a compressive force to the heat exchanger assembly along the height of each said manifold so as to bring the heat transfer surfaces of the flat tubes into thermal contact with side surfaces of the heat-generating electronic components;

wherein each said compression fixture is substantially U-shaped, having a thickness which is substantially the same as that of the heat-generating electronic components;

wherein each of the compression fixtures is insertable between adjacent flat tubes so as to surround the raised, apertured bosses of the flat tubes along three sides thereof and prevent unwanted deformation of the core plates during the step of applying a compressive force.

* * * * *

UNITED STATES PATENT AND TRADEMARK OFFICE
CERTIFICATE OF CORRECTION

Page 1 of 1

PATENT NO. : 10,928,141 B2
APPLICATION NO. : 15/913004
DATED : February 23, 2021
INVENTOR(S) : Benjamin A. Kenney et al.

It is certified that error appears in the above-identified patent and that said Letters Patent is hereby corrected as shown below:

On the Title Page

In item (72) in the Inventor section, please delete "Maehler" from the 2nd inventor's name and replace with --Machler--.

Signed and Sealed this
Sixth Day of April, 2021

Drew Hirshfeld
*Performing the Functions and Duties of the*
*Under Secretary of Commerce for Intellectual Property and*
*Director of the United States Patent and Trademark Office*